US007643957B2

(12) United States Patent
Daniel

(10) Patent No.: US 7,643,957 B2
(45) Date of Patent: Jan. 5, 2010

(54) BISECT DE-EMBEDDING FOR NETWORK ANALYZER MEASUREMENT

(75) Inventor: Erik S. Daniel, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 810 days.

(21) Appl. No.: 11/222,604

(22) Filed: Sep. 9, 2005

(65) Prior Publication Data

US 2006/0056310 A1    Mar. 16, 2006

Related U.S. Application Data

(60) Provisional application No. 60/608,671, filed on Sep. 10, 2004.

(51) Int. Cl.
*G06F 19/00* (2006.01)
*G06F 17/40* (2006.01)

(52) U.S. Cl. .................. 702/109; 73/431.1; 73/865.8; 73/865.9; 324/500; 324/537; 324/600; 324/615; 702/108; 702/187; 702/189

(58) Field of Classification Search .................. 73/1.01, 73/1.88, 432.1, 865.8, 865.9, 866.1, 866.5; 324/500, 511, 537, 600, 601, 612, 613, 615, 324/616, 614, 618, 619, 620, 754, 757, 617; 702/1, 85, 90, 104, 106, 107, 108, 109, 127, 702/187, 189, 190, 191, 194, 196
See application file for complete search history.

(56) References Cited

U.S. PATENT DOCUMENTS

| 2,980,853 | A | * | 4/1961 | Kline et al. | 324/765 |
| 3,082,374 | A | * | 3/1963 | Buuck | 324/73.1 |
| 3,212,001 | A | * | 10/1965 | Marshall | 324/704 |
| 3,219,927 | A | * | 11/1965 | Topp, Jr. et al. | 714/735 |
| 3,237,100 | A | * | 2/1966 | Chalfin et al. | 324/108 |
| 3,240,919 | A | * | 3/1966 | Schultz | 702/109 |
| 3,250,990 | A | * | 5/1966 | Hubbs et al. | 324/618 |

OTHER PUBLICATIONS

Koolen et al., "An Improved De-embedding Technique for On-wafer High-frequency Characterization", IEEE Bipolar Circuits and Technology Meeting 8.1, 1991, (pp. 188-191).
Padmanabhan et al., "Accurate Broadband On-Wafer SOLT Calibrations with Complex Load and Thru Models", IEEE, 2002, (pp. 5-10).
Song et al., "A De-embedding Technique for Interconnects", IEEE, 2001, (pp. 129-132).
Davidson et al., "LRM and LRRM Calibrations with Automatic Determination of Load Inductance", (6 pages), no date provided.

(Continued)

*Primary Examiner*—Edward R Cosimano
(74) *Attorney, Agent, or Firm*—Shumaker & Sieffert, P.A.

(57) ABSTRACT

Techniques for bisecting a symmetric, substantially transmissive two-port network (a THRU structure) through an optimization solution of the relevant equations defined by transmission matrix mathematics are described. Bisect de-embedding may be performed using a single substantially symmetric THRU structure, a first half of a first substantially symmetric THRU structure and a second half of a second substantially symmetric THRU structure, and by combining bisect de-embedding with conventionally known de-embedding techniques.

19 Claims, 17 Drawing Sheets

OTHER PUBLICATIONS

Tiemeijer et al., "A Calibrated Lumped-element De-embedding Technique for On-wafer RF Characterization of High-quality Inductors and High-speed Transistors", IEEE Transactions on Electron Devices, vol. 50, No. 3, Mar. 2003, (pp. 822-829).

Urteaga et al., "Power Gain Singularities in Transferred-Substrate InALAs-InGaAs-HBTs", IEEE Transactions on Electronic Devices, vol. 50, No. 7, Jul. 2003, (pp. 1589-1598).

Williams et al., "An Optimal Multiline TRL Calibration Algorithm", IEEE MTT-S Digest, 2003, (pp. 1819-1822).

Williams et al., "Accurate Characteristic Impedance Measurement on Silicon", IEEE MTT-S Digest, 1998, (pp. 1917-1920).

Williams et al., "An Optimal Vector-Network-Analyzer Calibration Algorithm", IEEE Transactions on Microwave Theory and Techniques, vol. 51, No. 12, Dec. 2003, (pp. 2391-2401).

Williams et al., "Comparison of On-Wafer Calibrations", (13 pages), no date provided.

Cho et al., "A Three-Step Method for the De-Embedding of High-Frequency S-Parameter Measurements", IEEE Transactions on Electron Devices, vol. 38, No. 6, Jun. 1991 (pp. 1371-1375).

Engen et al., "Thru-Reflect-Line": An Improved Technique for Calibrating the Dual Six-Port Automatic Network Analyzer, IEEE Transactions Microwave Theory and Techniques, vol. MTT-27, No. 12, Dec. 1979, (pp. 987-993).

Eo et al., "High-Speed VLSI Interconnect Modeling Based on S-Parameter Measurements", IEEE Transacstions on Components, Hybrids, and Manufacturing Technology, vol. 16, No. 5, Aug. 1993, (pp. 555-562).

Heuermann et al., "Line Network Network (LNN): An Alternative In-Fixture Calibration Procedure", IEEE Transactions on Microwave Theory and Techniques, vol. 45, No. 3, Mar. 1997, (pp. 408-413).

Daniel et al., "A Two-Port Network Bisection Method with Application to De-embedding of Network Analyzer Measurements", ARFTG2004 Special Issue Submission ARF-63-24, 2004 (pp. 1-10).

Daniel et al., "Network Analyzer Measurement De-embedding Utilizing a Distributed Transmission Matrix Bisection of a Single THRU Structure", (8 pages), $63^{rd}$ ARFTG Conf. Dig., Jun. 11, 2004.

W.H. Press et al., *Numerical Recipes in C*, Second Edition ed: Cambridge University Press, 1992, pp. 683-688.

* cited by examiner

—— THRU
······ Bisected Half of THRU

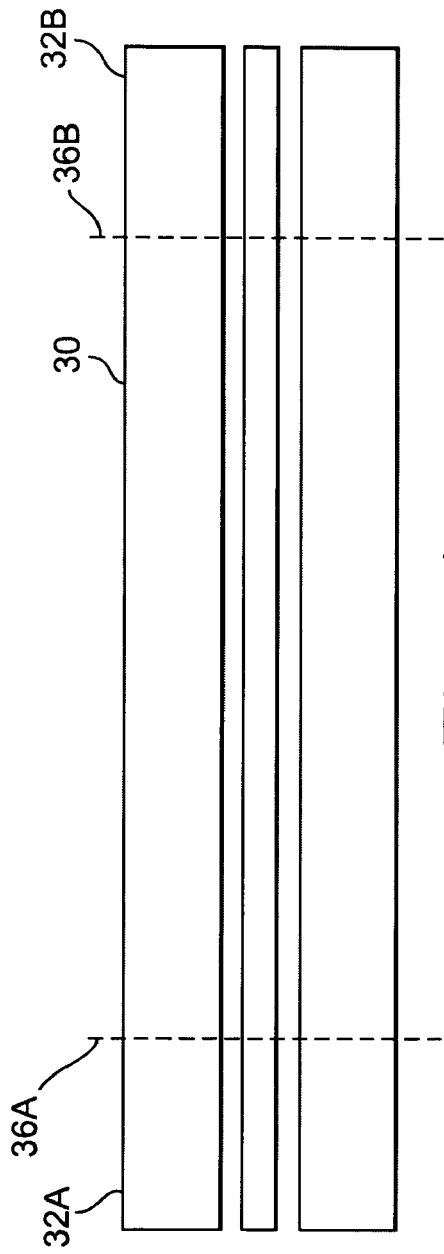
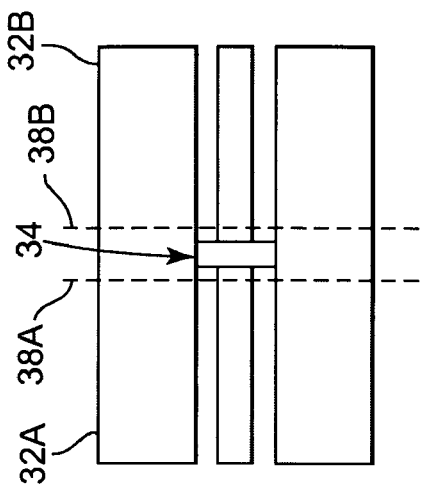
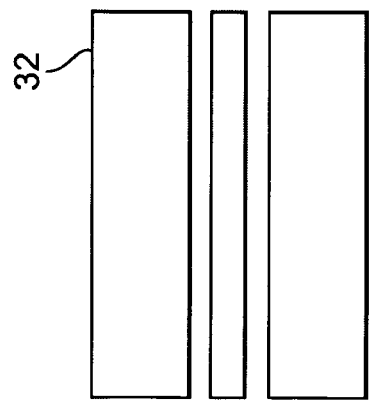
Fig. 6A
Fig. 6B
Fig. 6C

TRL Cal — LRRM Cal + Bisect De-embedding — LRRM Cal, No De-embedding

—— Y De-embedding
······· Bisect De-embedding

——— CPW
········ CPWG

BISECT DE-EMBEDDING FOR NETWORK ANALYZER MEASUREMENT

This application claims the benefit of Provisional Application Ser. No. 60/608,671, filed Sep. 10, 2004, now expired, the entire content of which is incorporated herein by reference.

BACKGROUND

The vector network analyzer (VNA) provides a framework for characterization of microwave properties of materials, semiconductor devices and circuits, transmission lines, and scores of other test subjects. Decades of research and development work have produced a wealth of calibration methods, used to remove the effects of cables, probes, and other portions of the measurement apparatus, leaving only the desired device under test (DUT) between the reference planes (the demarcation lines separating calibrated measurement apparatus from measurement subject). However, in many cases, it is not practical to arrange that the entirety of unwanted effects is removed using these calibration procedures. In these cases, calibration is often followed by de-embedding—a procedure which moves the calibration reference planes closer together, moving portions of what otherwise would be the DUT outside of the reference planes.

High frequency on-wafer measurements of single transistors, simple circuits, and transmission line structures are critical to characterization and development of advanced integrated circuit technologies. Although there exist many possible calibration and de-embedding methods, each has its drawbacks. Although on-wafer calibrations may be performed (TRL, LRM, LRRM, etc.), these require a number of precisely designed, fabricated, and verified calibration structures which consume significant amounts of expensive wafer real estate and which may not be trivial to reproduce at the desired level of precision, particularly in advanced and emerging integrated circuit processes in which process steps may be intentionally (or unintentionally) varied in order to explore design space.

Off-wafer calibrations do not suffer from the same constraints, but introduce other difficulties. For example, differences in the probing environment between the calibration substrate and the measurement substrate (e.g., substrate dielectric constant, substrate thickness, etc.) lead to ambiguity in the calibration reference plane. Perhaps most importantly (particularly for single transistor measurements) the effects of the on-wafer probe pads and traces leading to the desired device under test (DUT) can overwhelm the DUT response. A wealth of de-embedding techniques can be used to solve these issues, pushing the effective reference planes defined by an off-wafer calibration to some on-wafer location, but these, too, have limitations. The most widely used techniques for transistor measurement involve open (Y) and/or short (Z) subtraction, which have been proven quite useful at lower frequencies, but which are limited in use at higher frequencies because, although the mathematics and matrix formulations are by nature distributed, the common Y and Z subtraction methods treat shunt and series components separately and hence amount to lumped element subtractions of capacitive and inductive parasitics. Although in principal, this lumped element limitation can be mitigated by reducing the dimensions of the probe pads and lead-in traces, as the measurement frequencies increase, decreasing the probe-probe spacing leads to excessive probe-probe coupling which can significantly negatively impact the measurements.

Other de-embedding techniques which do not suffer from the same lumped element constraints as the Y and Z subtraction techniques have been developed. However, these techniques generally require several precisely fabricated structures and/or they make assumptions regarding the network to be de-embedded which may be difficult to ensure. Therefore, implementation of these de-embedding techniques (e.g. for on-wafer measurement) can prove equally difficult to implement as calibration techniques which could supplant the de-embedding procedure (e.g. fabrication of on-wafer calibration structures), or which are limited to the same range of applicability as other methods (e.g. the lumped element approximation implicit in Y and Z subtraction methods).

SUMMARY

Bisect de-embedding techniques described herein include bisecting transmission characteristics of a substantially symmetric two-port network (referred to herein as a "THRU" structure) into first and second substantially mirrored halves. Bisect de-embedding utilizes transmission matrix mathematics to split a substantially symmetric THRU structure into mirrored halves which may then be mathematically removed from both ports of a two port measurement structure, leaving only the desired device under test ("DUT"). Bisect de-embedding may offer the accuracy and high frequency utility of on-wafer calibration methods without the required fabrication and design precision or wafer real estate, and provides an alternative to de-embedding techniques limited by lumped element assumptions.

In one embodiment, the invention is directed to a method comprising bisecting transmission characteristics of a measurement structure into mirrored halves, determining transmission characteristics of the measurement structure containing an embedded device under test, and mathematically removing the mirrored halves from the determined transmission characteristics to determine transmission characteristics of the device under test.

In another embodiment, the invention is directed to a method comprising de-embedding a device under test from between a first half of a first substantially symmetric THRU structure and a second half of a second substantially symmetric THRU structure, wherein de-embedding the device under test further includes bisecting transmission characteristics of a first substantially symmetric THRU structure into first and second mirrored halves, and bisecting transmission characteristics of a second substantially symmetric THRU structure into first and second mirrored halves.

In another embodiment, a computer-readable medium comprises instructions. The instructions cause a programmable processor to bisect transmission characteristics of a substantially symmetric THRU structure into first and second mirrored halves, measure transmission characteristics of a measurement structure containing a device under test embedded between the first mirrored half of the first THRU structure and the second mirrored half of the second THRU structure, and mathematically remove transmission characteristics of the first mirrored half of the first THRU structure and the second mirrored half of the second THRU structure from the measured transmission characteristics to determine transmission characteristics of the device under test.

In another embodiment, the invention is directed to a method comprising bisect de-embedding a device under test to obtain intermediate transmission characteristics, and de-embedding the intermediate transmission characteristics using one of Y de-embedding, Z de-embedding, Y+Z de-embedding, Z+Y de-embedding, or any other known de-embedding method to obtain transmission characteristics of the device under test, wherein bisect de-embedding the device under test includes bisecting a substantially symmetric THRU structure into first and second mirrored halves.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

FIG. 2A shows S21 magnitude, FIG. 2B shows S21 phase, FIG. 2C shows S11 magnitude, and FIG. 2D shows S11 phase for a long transmission line.

FIG. 4A shows S21 magnitude. FIG. 4B shows S21 phase, FIG. 4C shows S11 magnitude, and FIG. 4D shows S11 phase for a long transmission line.

FIGS. 6A-6C show block diagrams of an example transmission line structure (FIG. 6A), a THRU structure (FIG. 6B), and a measurement structure (FIG. 6C).

FIG. 7A shows measurements of S21 magnitude, FIG. 7B shows S21 phase, FIG. 7C shows S11 magnitude, and FIG. 7D shows S11 phase for a long transmission line.

FIG. 12A shows ft computed from h21, FIG. 12B shows fmax computed from Gmax (MSG/MAG), and FIG. 12C shows fmax computed from U (Mason's unilateral gain).

DETAILED DESCRIPTION

Bisect de-embedding techniques described herein include bisecting transmission characteristics of a substantially symmetric two-port network (referred to herein as a "THRU" structure) into first and second substantially mirrored halves. Bisect de-embedding utilizes transmission matrix mathematics to split a substantially symmetric THRU structure into mirrored halves which may then be mathematically removed from both ports of a two port measurement structure, leaving only the desired device under test ("DUT"). Bisect de-embedding offers the accuracy and high frequency utility of on-wafer calibration methods without the required fabrication and design precision or wafer real estate, and provides an alternative to de-embedding techniques limited by lumped element assumptions.

The bisect de-embedding techniques described herein include, for example, bisect de-embedding using a single substantially symmetric THRU structure, bisect de-embedding using a first half of a first substantially symmetric THRU structure and a second half of a second substantially symmetric THRU structure, and by combining bisect de-embedding with conventionally known de-embedding techniques.

Figure 1A:
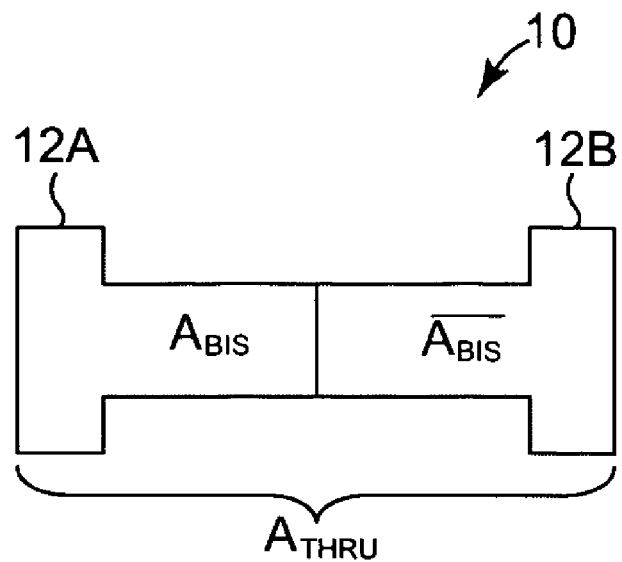
FIGS. 1A and 1B show a graphical representation of transmission matrix bisect de-embedding, showing a THRU structure (FIG. 1A) and a measurement structure containing an embedded device under test (FIG. 1B).
Figure 1B:
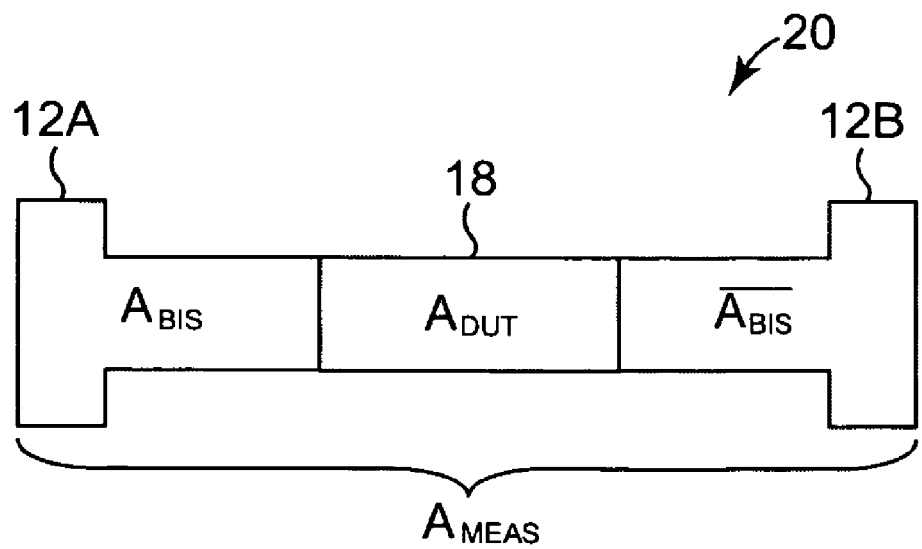

FIGS. 1A and 1B are block diagrams showing the structures utilized for the bisect de-embedding techniques described herein. FIG. 1A shows a substantially symmetric THRU structure 10 having an associated transmission matrix $A_{THRU}$. THRU 10 includes two substantially symmetric mirrored halves 12A and 12B having associated transmission matrices $A_{BIS}$ and $\overline{A_{BIS}}$, respectively. FIG. 1B shows a measurement structure 20 including a device under test (DUT) 18 positioned between halves 12A and 12B of THRU 10. Measurement structure 20 has an associated transmission matrix $A_{MEAS}$. DUT 18 has an associated transmission matrix $A_{DUT}$. The techniques described herein utilize transmission matrix mathematics to split the substantially symmetric THRU structure 10 into substantially mirrored halves 12A and 12B which may then be mathematically removed from both ports of the two port measurement structure, leaving only DUT 18.

Bisect de-embedding utilizes transmission matrix mathematics to split a substantially symmetric THRU structure into mirrored halves which may then be mathematically removed from both ports of a two port measurement structure, leaving only the desired DUT 18. A two-port structure, such as THRU 10, may be represented as a 2×2 matrix S defined as follows:

$$S \equiv \begin{bmatrix} s_{11} & s_{12} \\ s_{21} & s_{22} \end{bmatrix}$$

The S-parameters $s_{11}$, $s_{12}$, $s_{21}$, and $s_{22}$, the reflection and transmission coefficients between incident and reflected waves, describe the behavior of a device under linear conditions at microwave frequency range. The S-parameters are defined as follows:

S11: input reflection coefficient of 50Ω terminated output.
S21: forward transmission coefficient of 50Ω terminated output.
S12: reverse transmission coefficient of 50Ω terminated input.
S22: output reflection coefficient of 50Ω terminated input.

S-parameters may be converted to other parameters such as hybrid (H), admittance (Y), or ABCD parameters. For example, an ABCD matrix A may be defined as follows:

$$A \equiv \begin{bmatrix} a & b \\ c & d \end{bmatrix}$$

Stability factor (K) and many gain parameters may also be computed from the s-parameters.

THRU 10 may be characterized by two unique complex numbers per frequency (as S11=S22 and S21=S12 for a symmetric THRU), whereas the bisected components in general may be characterized by three complex numbers per frequency (S21=S12 assuming the structure is reciprocal, but in general S11 does not equal S22). The present invention recognizes that measured S-parameters on a THRU structure may not be exactly symmetric (due to both measurement error and nonidealities in the physical structure) and in fact it shall be understood that the invention does not require that THRU 10 be exactly symmetric. The problem mathematically becomes overdetermined rather than underdetermined, and that there may be additional constraints on reasonable THRU structures, constraining (among other things) behavior of the S-parameters over frequency. This will be explained further below.

In the embodiment described with respect to FIGS. 1A and 1B, S-parameters may be converted to ABCD matrix format for performing the required network computations, though cascade matrices or other transmission matrix representations would be equally applicable, and the invention is not limited in this respect. In order to bisect THRU 10 into mirror image halves 12A and 12B, for example, one desires to solve the following ABCD matrix equation:

$$A_{BIS} \cdot \overline{A_{BIS}} = A_{THRU} \quad (1)$$

where the overbar indicates symmetric conjugation defined as follows:

$$\overline{\begin{bmatrix} a & b \\ c & d \end{bmatrix}} \equiv \frac{1}{ad-bc} \begin{bmatrix} d & b \\ c & a \end{bmatrix} \quad (2)$$

Physically, the symmetric conjugate of an ABCD matrix describes the same physical structure as the original ABCD matrix but with the two ports reversed.

To bisect a substantially symmetric THRU structure in to first and second substantially mirrored halves, the bisect de-embedding techniques described herein utilize an iterative optimization technique and constraints on the solution over frequency to split a substantially symmetric two-port network into solutions of substantially mirrored halves. As mentioned above, Equation 1 for $A_{BIS}$ generally has no solution unless $A_{THRU}$ is exactly symmetric (i.e., equal to its own symmetric conjugate). In practice, measurement error and slight asymmetries in a physical THRU structure may therefore cause there to be no exact solution to this equation. It may therefore be solved approximately. In one embodiment, a Levenberg-Marquardt optimization of the complex components a, b, c, and d at each frequency point is performed, subject to the constraints defined in the above equation for $A_{BIS}$. An example implementation of a Levenberg-Marquardt optimization may be found in W. H. Press, A. A. Teukolsky, W. T. Vetterling, and B. P. Flannery, *Numerical Recipes in C*, Second Edition ed: Cambridge University Press, 1992, pp. 683-688, which is incorporated herein by reference in its entirety.

In order to properly constrain the solution, an additional equation is needed: ad−bc=1. This is equivalent to the S21=S12 reciprocity restriction for the bisected half of the THRU (a correct assumption for passive non-magnetic THRU structures). Convergence to the appropriate solution is encouraged through utilization of lower frequency solutions as initial starting solutions for subsequent frequency solutions.

An initial guess of the solution variables at each frequency point is made. For example, in one embodiment, as the characteristics of the typical THRU structure vary relatively slowly with typical measured frequency steps, the initial guess for each frequency may be taken to be the solution at the previous frequency. Also, in one embodiment, the initial guess for the first frequency may be taken to be the unit matrix, representing lossless transmission with zero phase delay. If the first frequency is larger than the self-resonant frequency of the THRU, a first initial guess with a rough estimate of the phase delay may place the solution in the correct phase quadrant.

Once $A_{BIS}$ (the transmission matrix for the first half 12A of THRU 10) has been obtained, $A_{DUT}$ (the transmission matrix for the device under test) may be computed as follows:

$$A_{DUT} = A_{BIS}^{-1} \cdot A_{MEAS} \cdot (\overline{A_{BIS}})^{-1} \quad (3)$$

For the bisect de-embedding techniques of the present invention, THRU 10 is substantially symmetric. It shall be understood, however, that THRU 10 need not be exactly symmetric. Symmetry is not a rigid requirement (for example, as is mentioned above, measured data may not be exactly symmetric), and the method is robust even in the presence of designed-in asymmetries, as will be further described below. In some embodiments, THRU 10 may also be substantially transmissive (i.e., not highly reflective). It is not required that the THRU be a transmission line of known impedance or have any other specific known characteristic.

Validation of bisect de-embedding will now be described through application to bisection of a simulated THRU structure and to bisection of a measured THRU.

Figure 2A:
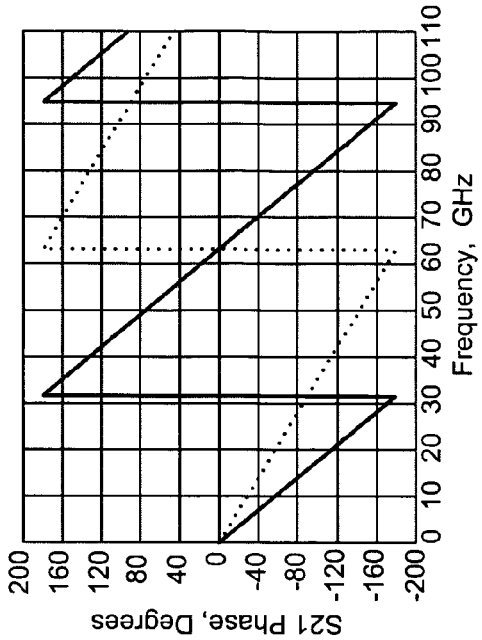
FIGS. 2A-2D show a simulated lossy transmission line structure and its computed bisected half.
Figure 2B:
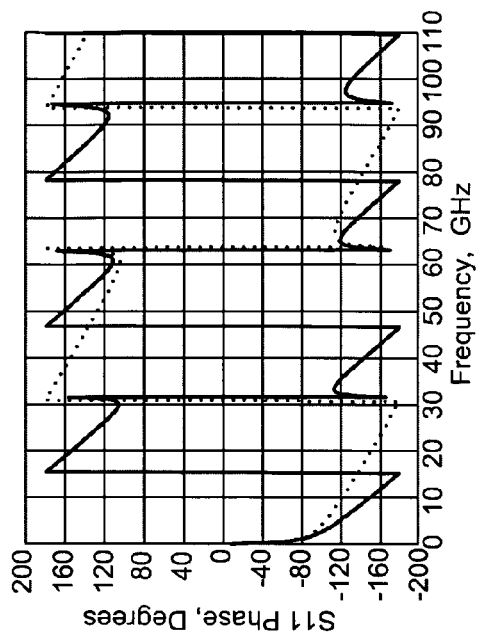
Figure 2C:
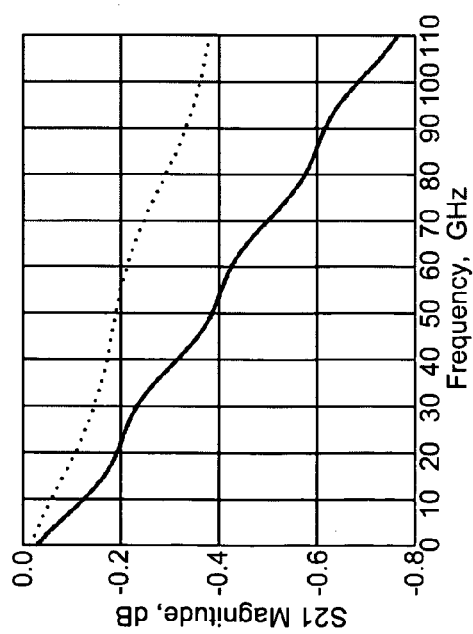
Figure 2D:
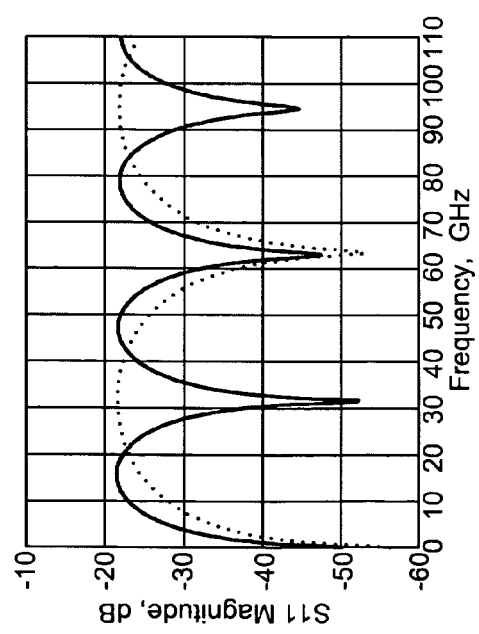

In order to test application of the bisection algorithm to a perfectly symmetric virtually noiseless set of data, S-parameters of a lossy transmission line of approximately 46 Ohm impedance (in high frequency limit) and 16 ps electrical length were generated over a frequency range from DC to 100 GHz. Both dielectric losses and skin effect losses were included. S-parameters for a bisected half of the transmission line were computed by converting the S-parameters to ABCD parameters, executing the algorithm described above, followed by conversion back to S-parameters (assuming 50 Ohm port impedance). The insertion loss and return loss corresponding to port 1 stimulus (S21 and SI 1) are plotted in FIGS. 2A-2D in both magnitude and phase for both the original THRU line and the bisected half. FIG. 2A shows S21 magnitude, FIG. 2B shows S21 phase, FIG. 2C shows S11 magnitude, and FIG. 2D shows S11 phase.

As mentioned above, in the event that the THRU S-parameters are exactly symmetric (as is the case here to within numerical precision), the solution to equation (1) is not uniquely determined, yet inspection of FIGS. 2A-2D indicates that the solution provided by the algorithm is useful. The insertion loss of the bisected half is half that of the original THRU (both in magnitude and phase). Similar observations can be made regarding the return loss. The THRU length and frequency span were chosen such that the data span significantly more than 360 degrees of phase of the THRU, demonstrating that the algorithm converges to the correct solution over wide ranges of phase and is not limited to ranges of frequency or delay dictated by the THRU structure parameters. Also, note that the impedance of the THRU (while spatially uniform in this example) was arbitrarily chosen and deviates from, for example, the 50 Ohm port impedance.

Figure 3:
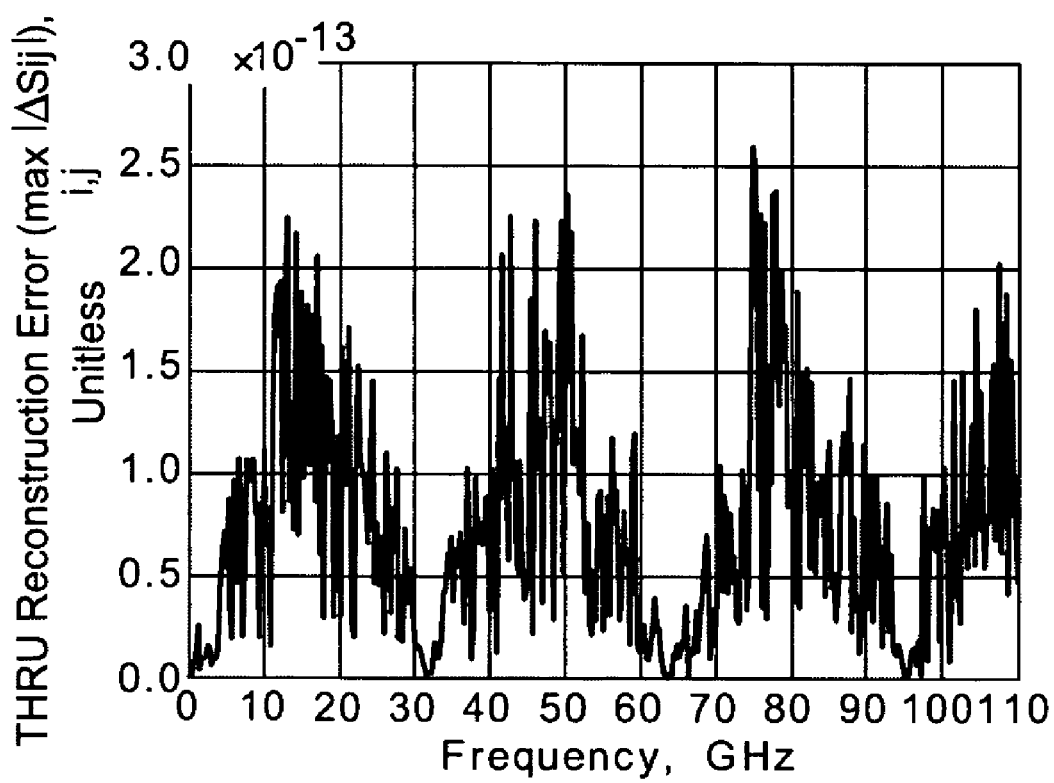
FIG. 3 shows magnitude of maximum error in S-parameters of reconstructed THRU relative to original simulated lossy transmission line THRU.
Figure 4A:
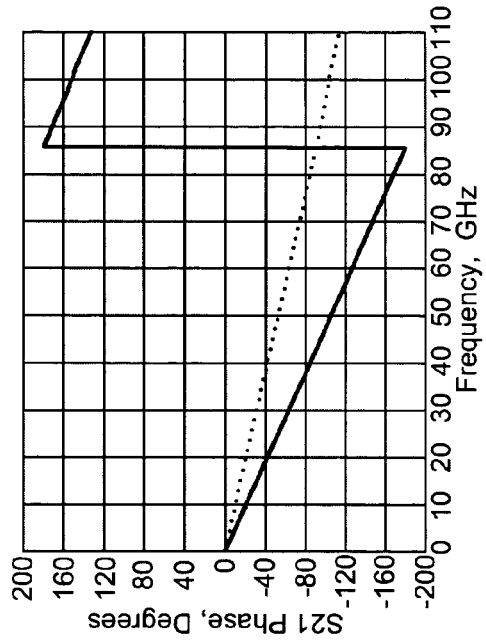
FIGS. 4A-4D show measured CPWG (grounded coplanar waveguide) transmission line structure and its computed bisected half.
Figure 4B:
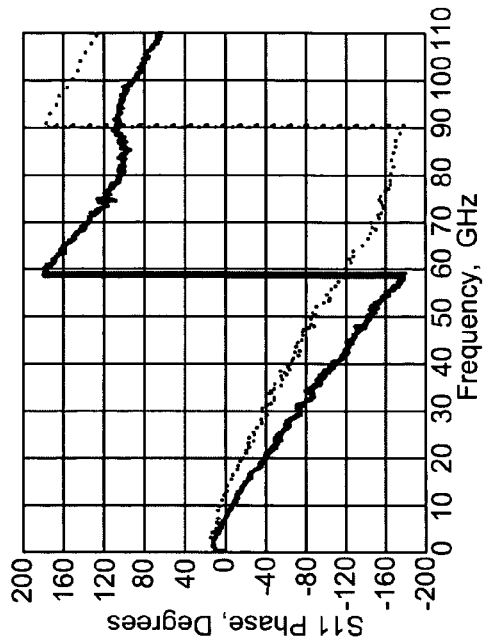
Figure 4C:
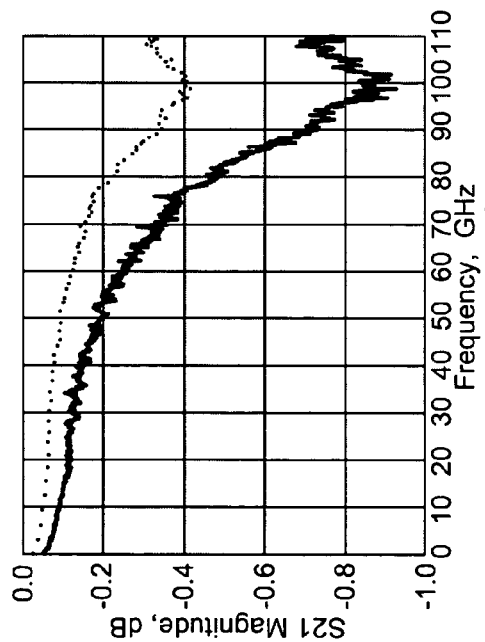
Figure 4D:
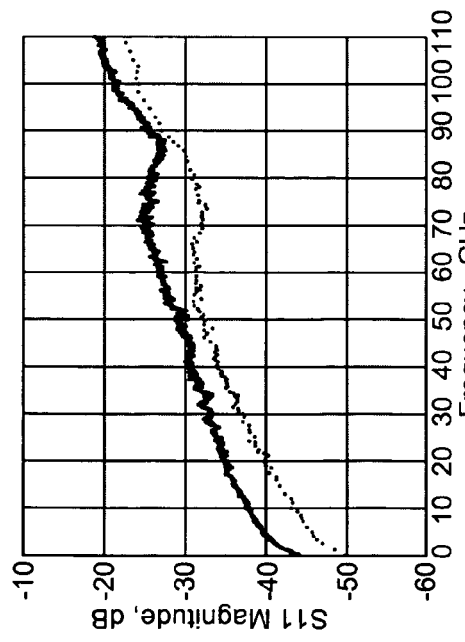

In order to verify that the bisected half of the THRU does in fact represent a solution of equation (1), the bisected half may be chained with its symmetric conjugate and then compared with the original THRU. FIG. 3 contains a plot of the maximum amplitude of the difference of each of the four separate S-parameters over the range of frequency considered. In equation form, the following error quantity is plotted:

$$\max_{i,j} |\Delta S_{ij}| \quad (4)$$

where $$\Delta S_{ij} = S_{ij}^{Original} - S_{ij}^{Reconstruct} \quad (5)$$

with $S^{original}$ representing the S-parameters of the original THRU and $S^{reconstruct}$ representing S-parameters of the THRU reconstructed from the chain of the bisected half with its conjugate.

As can be seen in FIG. 3 from the very small magnitude of the error residuals ($\sim 10^{-13}$), the bisected half does very closely represent a solution of equation (1) and in fact is limited primarily by the specific choice of parameters defining convergence criteria for the solution iterations.

Validation of bisect de-embedding as it applies to measured data which is not precisely symmetric and hence supports no exact solution of (1) is now described. For this purpose, measurements were performed on a grounded coplanar waveguide (CPWG) THRU of roughly 16 ps electrical length, fabricated in an InP HEMT integrated circuit process. The test structures are described in more detail elsewhere. These measurements were carried out on an Agilent HP8510XF VNA. An off-wafer LRRM calibration (using a GGB Industries CS-5 impedance standard substrate) was performed using Cascade Microtech Wincal™ software.

As above, magnitude and phase of insertion loss and return loss measured with port 1 stimulus are shown in FIGS. 4A-4D for both the measured THRU and the computed bisected half. As before, the insertion loss magnitude and phase of the bisected half is half that of the original THRU and the computed bisected half. As before, the insertion loss magnitude and phase of the bisected half is half that of the original THRU. The return loss cannot be analyzed simply with factors of two for several reasons. First, as will be discussed shortly, the measured THRU is not exactly symmetric. Second, it is not expected that the bisected half should necessarily be symmetric in this case, as the probe-to-CPWG transition only occurs at the THRU endpoints. In fact S11 and S22 of the bisected half do differ slightly, but only S11 is presented in the interest of brevity. Finally, quite note that the THRU transmission line return loss is quite small in magnitude and hence more sensitive to measurement error. Nonetheless, the bisected data represents the expected bisection solution with respect to insertion loss and a reasonable solution with respect to return loss.

Figure 5A:
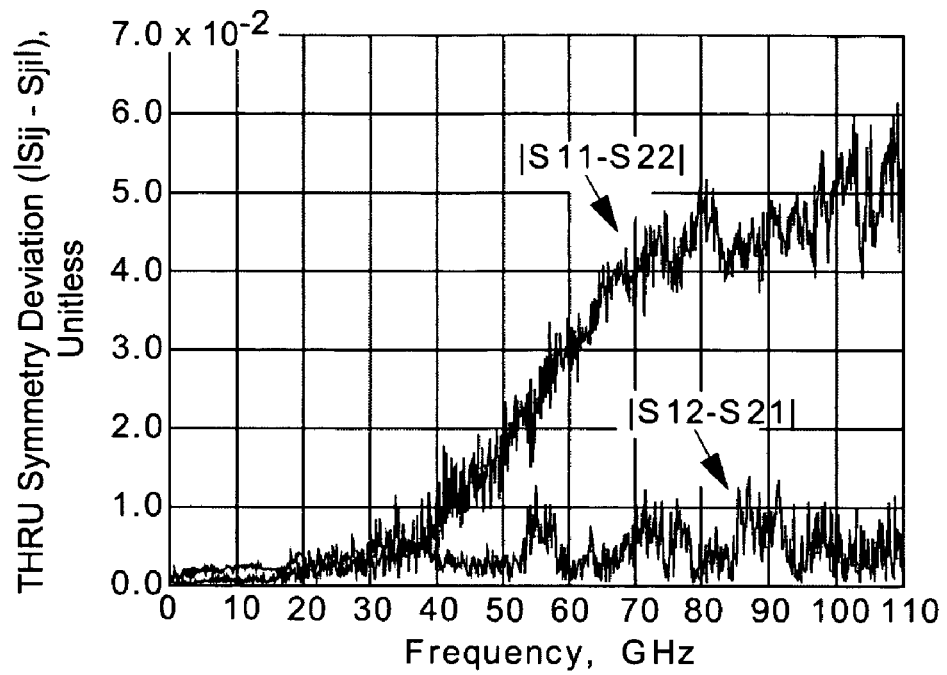
FIG. 5A shows the magnitude of deviations of THRU S-parameters from symmetry.
Figure 5B:
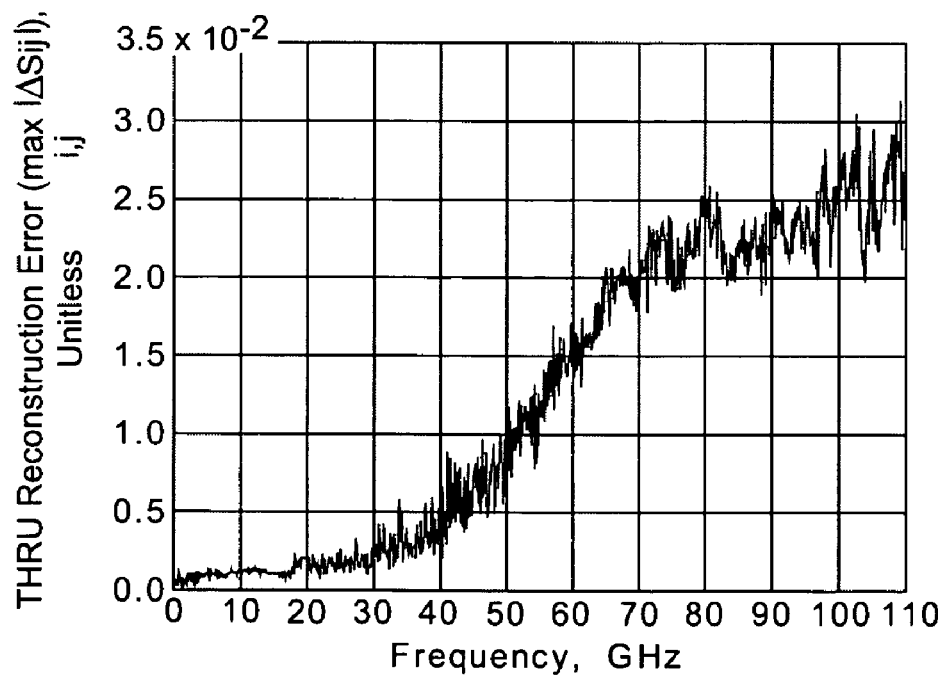
FIG. 5B shows the magnitude of maximum error in S-parameters of reconstructed THRU relative to original measured CPWG THRU.

As with the numerical THRU data, in order to verify that the bisected THRU represents a solution of equation (1), we examine the error in the reconstructed THRU. However, first, in FIG. 5A we plot the deviation from symmetry in the S-parameters in order to determine the expected magnitude of deviation from ideal THRU reconstruction given that an exact solution of equation (1) is not possible. As can be seen in FIG. 5A, deviations from symmetry are on the order of $10^{-2}$. Even in the presence of asymmetry, the THRU structure should be reciprocal, hence deviations in S12-S21 represent measurement or calibration errors. Although this THRU was designed to be exactly symmetric, deviations in S11-S22 (which are somewhat larger) may also include slight asymmetries in the measurement structure (or perhaps the probing environment). Given these deviations from symmetry, we can expect the error plotted in FIG. 5B to have a lower bound of one half of the maximum of the two errors plotted in FIG. 5A, as the minimum error solution would be given by the symmetrized form $$S^{sym} = \frac{1}{2}\begin{pmatrix} S_{11} + S_{22} & S_{21} + S_{12} \\ S_{21} + S_{12} & S_{11} + S_{22} \end{pmatrix} \quad (6)$$

which deviates from both the original THRU S-parameter matrix and its symmetric conjugate by half of the difference between the two. FIG. 5B has been plotted on a vertical scale of half that of FIG. 5A to illustrate that the reconstruction error is minimized.

In some cases, the algorithm may converge to undesired solutions. For example, one could not expect the algorithm to converge to a useful bisected solution for an OPEN structure with little transmission between the ports (e.g. a capacitance between port 1 and 2), as the starting solution for the lowest frequency iterations (by default) is assumed to be a unity transmission matrix. More generally, if the reflection of the THRU is particularly poor, the algorithm may converge to an unwanted solution. This behavior has been observed when bisect de-embedding has been applied to simulated THRU structures deviating significantly from the ideal (e.g. with very low transmission and significant return loss). No such behavior has been observed when applied to measured THRU data, though all THRU structures to which the method has been applied to date were characterized with reasonable return loss (better than −5 dB). This behavior may be related to the difference between solution of an undetermined system in the case of exactly symmetric data versus an overdetermined system in the case of (nonideal) measured data, but his has not been further investigated at present. The algorithm can converge to an incorrect phase if the lowest frequency considered is not within the initial 180 degrees of phase of the bisected THRU structure (e.g. for measured data which does not begin near DC). This can be rectified simply by adjusting the phase of the initial starting solution.

Validation of bisect de-embedding through application to measurement of a range of test structures and comparison to alternative methods will now be described. For all examples presented here, the algorithm described above was implemented through a series of Perl scripts and compiled C language routines. Average runtimes for the de-embedding computations on measured data files with 400-800 data points were on the order of 10-20 seconds on a modern Unix workstation.

In order to evaluate the efficacy of the bisect de-embedding method, it is desirable to make as direct a comparison as possible to another better known method. On-wafer TRL calibration structures provide for an excellent comparison mechanism, as the THRU used for the TRL calibration can also be used as the THRU for the bisect de-embedding procedure, moving an off-wafer calibration reference plane to the same position defined by the on-wafer TRL calibration. The primary difficulties in carrying out this comparison are that well-characterized on-wafer TRL calibration structures are required, and that differences between the on-wafer calibration and the off-wafer calibration plus de-embedding can be brought about either by imperfections in the de-embedding method or by differences in the details of the two calibrations (e.g., differences in the effective port impedance resulting from the two calibrations). This will be discussed further below with respect to the specific measured data.

FIGS. 6A-6C are representative diagrams of example test structures used for this purpose. The structures are based on grounded coplanar waveguide (CPWG). FIG. 6A shows a diagrams of an example measurement structure having a T-line 30 (~10 ps electrical length) used for the 5-40 GHz range of TRL calibration, FIG. 6B shows a diagram of an example THRU 32 used for both the TRL calibration and the bisect de-embedding, and FIG. 6C shows a diagram of an example sample structure 34 (a HEMT device in the examples described herein) embedded within THRU 32. Also used for the TRL calibration (not shown) are a shorter T-line (~1.5 ps electrical length) used for the 40-110 GHz frequency range and SHORT reflect standards. The on-wafer TRL calibration reference planes 36A and 36B (the same as the reference planes after off-wafer calibration plus bisect de-embedding) are indicated in FIG. 6A, as well as first and second mirrored halves of THRU structure 32A and 32B, respectively. Reference planes 38A and 38B for bisect de-embedding are indicated in FIG. 6C, as well as first and second mirrored halves of THRU structure 32A and 32B, respectively.

FIGS. 7A-7D illustrate S-parameter data measured on the long transmission line shown in FIG. 6A using two different methods: 1) On-wafer TRL calibration, and 2) off-wafer LRRM calibration (using a GGB Industries CS-5 impedance standard substrate) plus bisect de-embedding. The measurement with the off-wafer calibration is also shown before de-embedding. Both calibrations utilized Cascade Microtech Wincal™ software, and measurements were carried out with an HP8510XF VNA.

Figure 7A:
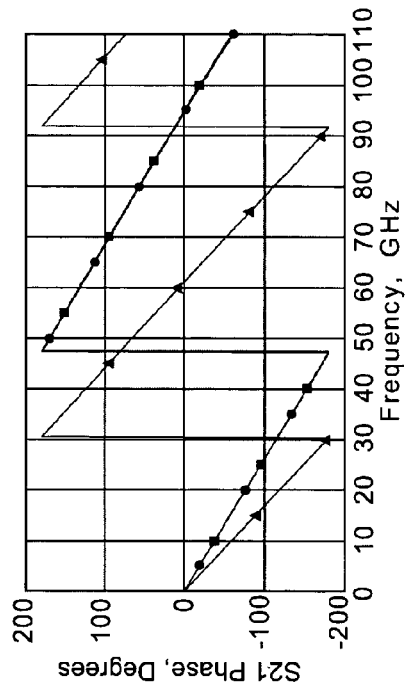
FIGS. 7A-7D show a comparison of on-wafer calibration to off-wafer calibration plus bisect de-embedding.
Figure 7B:
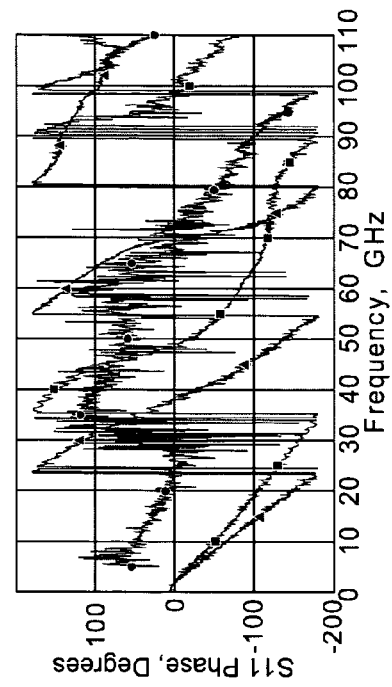
Figure 7C:
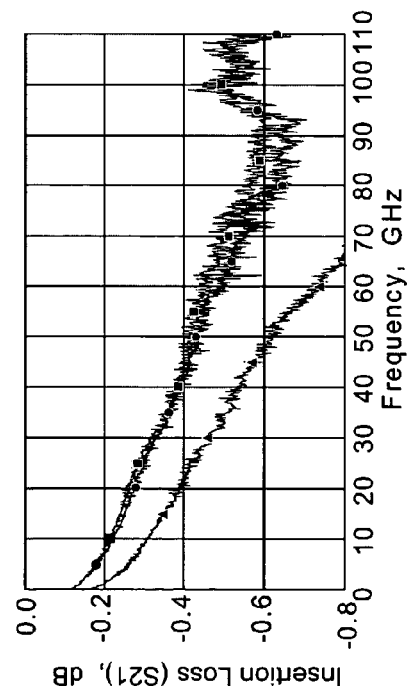
Figure 7D:
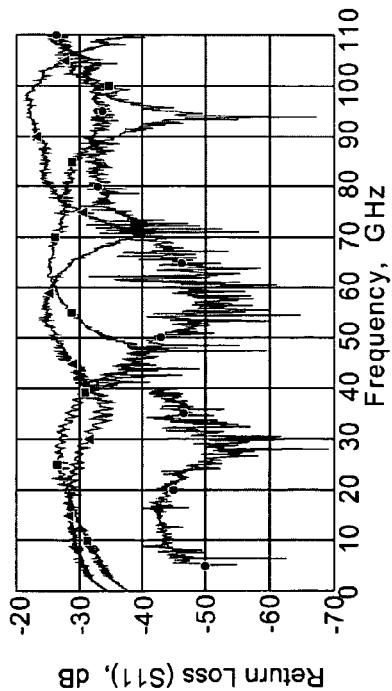
Figure 8A:
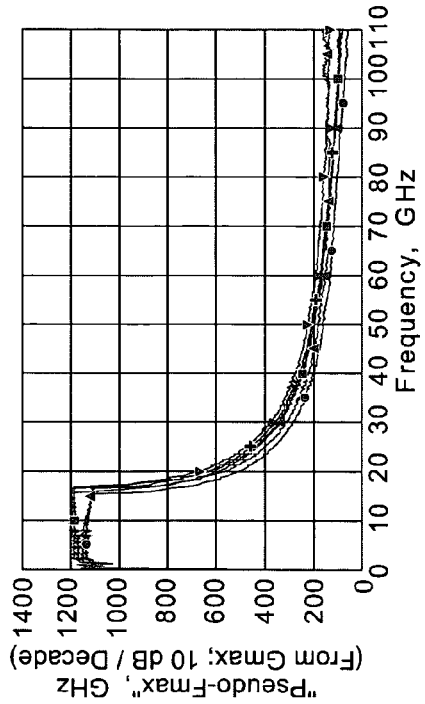
FIGS. 8A-8D show comparisons of various de-embedding methods applied to ft and fmax characterization of a SiGe HBT.
Figure 8B:
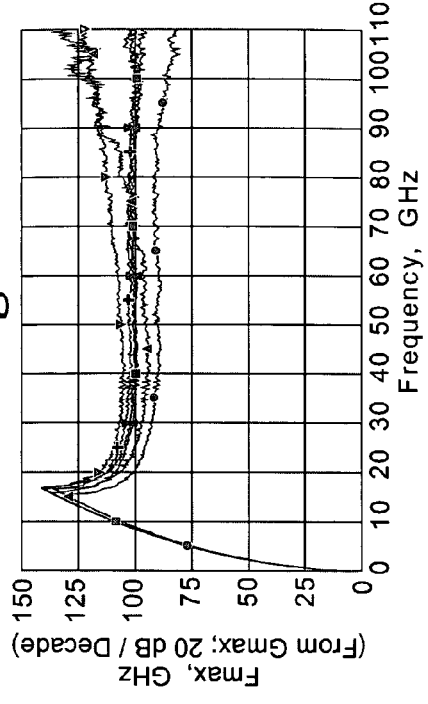
Figure 8C:
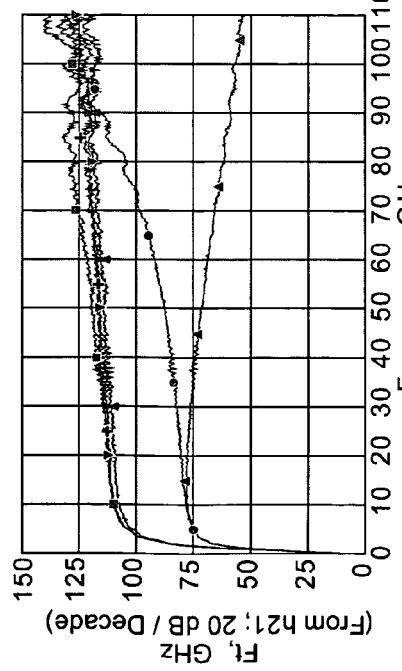
Figure 8D:
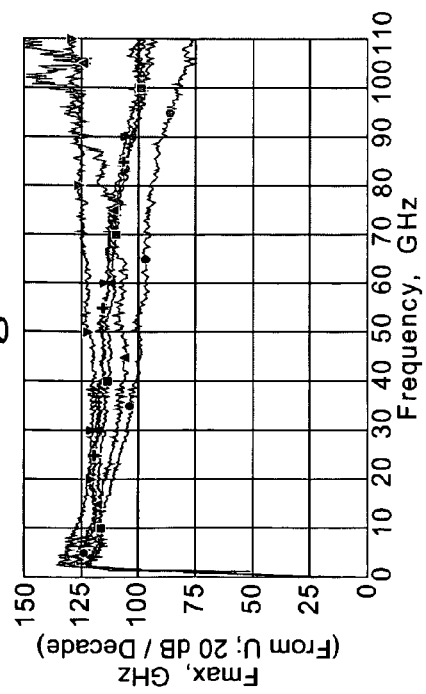
Figure 9A:
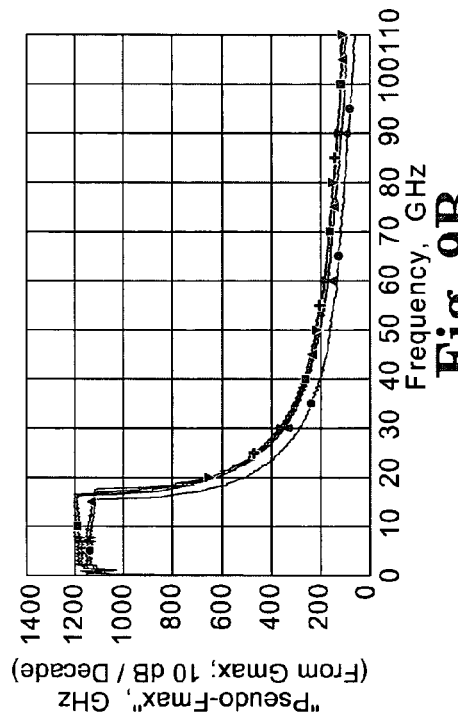
FIGS. 9A-9D show comparisons of various de-embedding methods used in conjunction with bisect de-embedding, applied to ft and fmax characterization of a SiGe HBT.
Figure 9B:
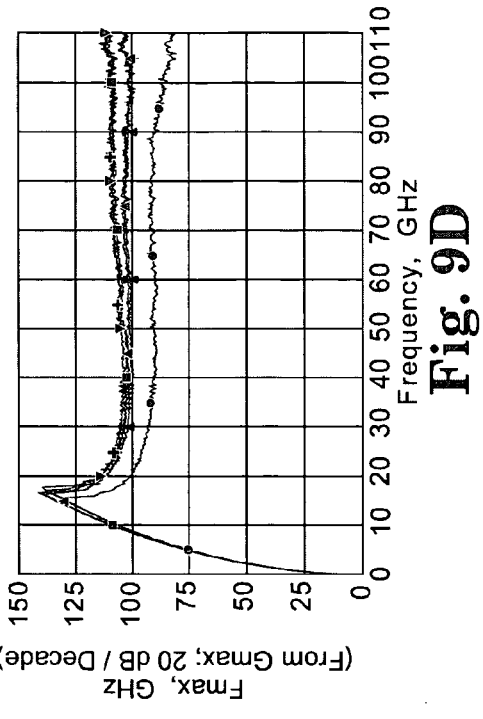
Figure 9C:
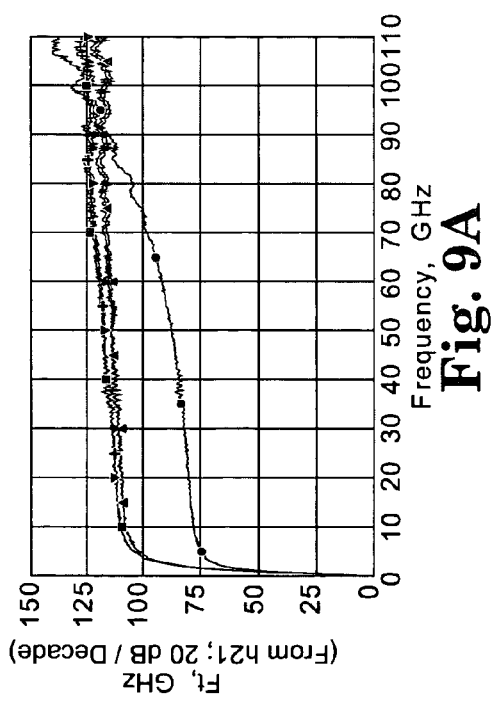
Figure 9D:
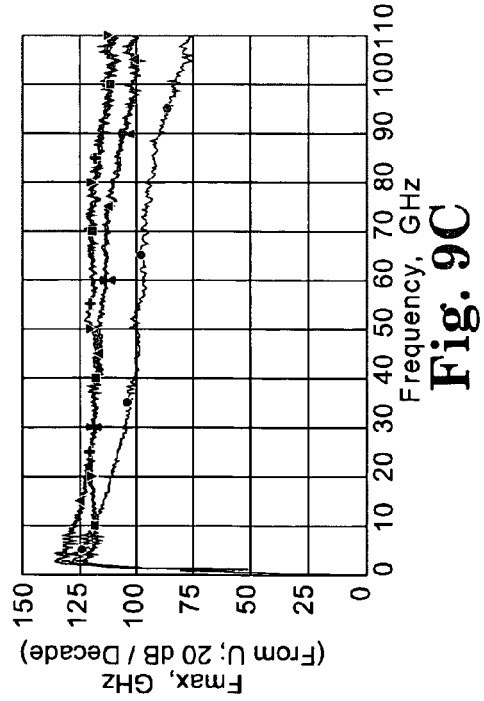
Figure 10B:
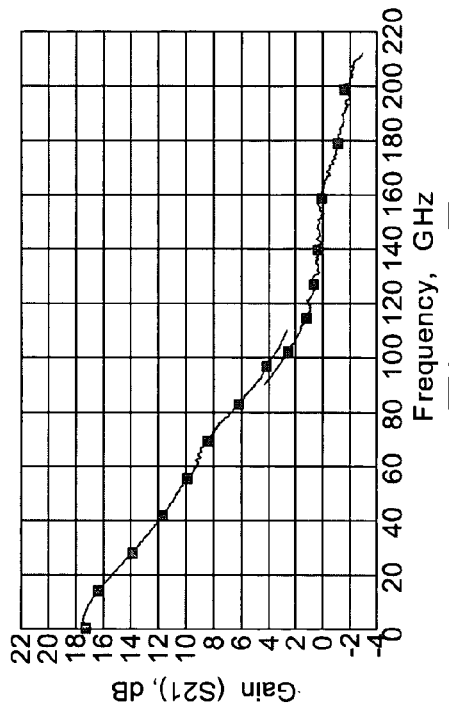
FIGS. 10A-10D show raw (not de-embedded) S-parameters (FIGS. 10A-10C) and h21 and Gmax (FIG. 10D) of an InP HEMT device measured over three separate frequency ranges.
Figure 10D:
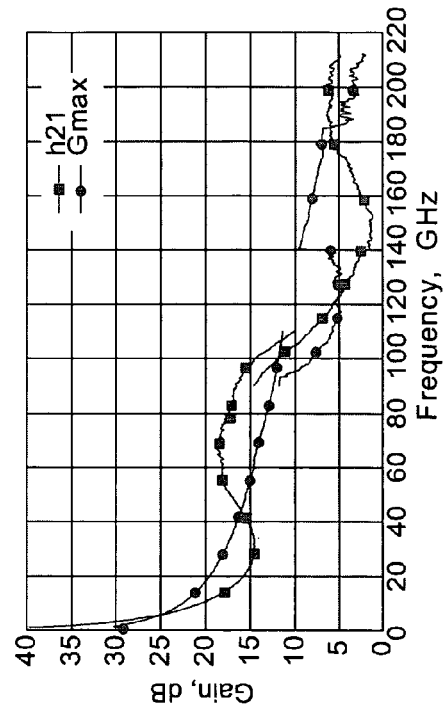
Figure 10A:
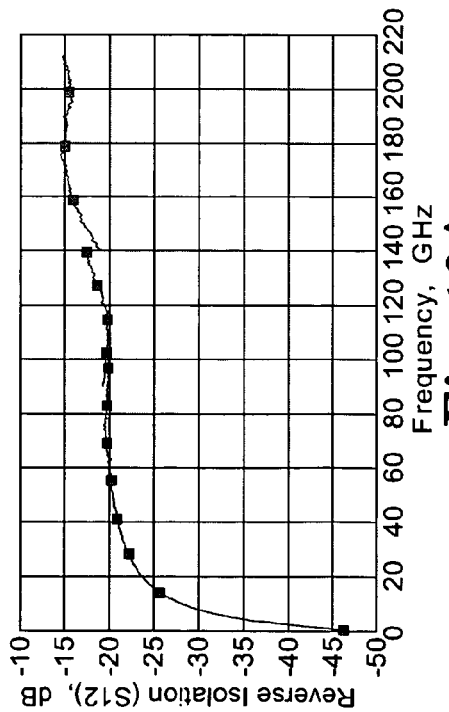
Figure 10C:
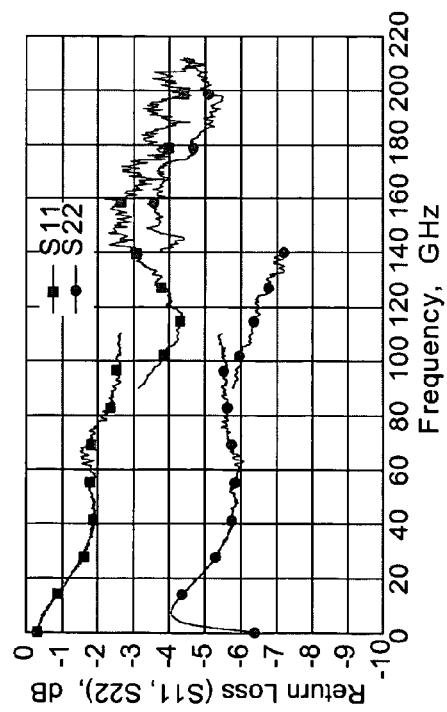
Figure 11A:
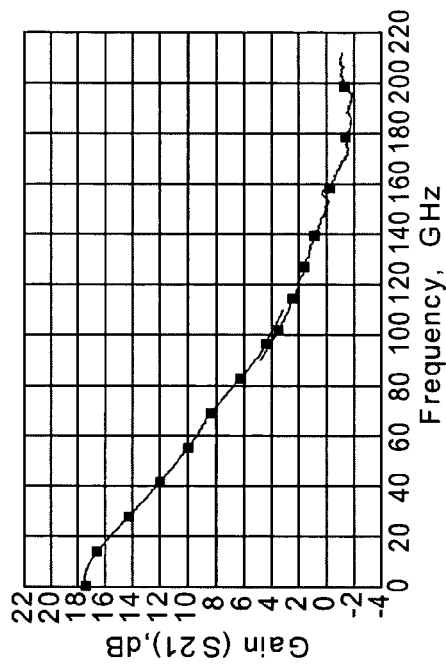
FIGS. 11A-11D show dc-embedded S-parameters (FIGS. 11A-11D) and h21 and Gmax (FIG. 11D) of an InP HEMT device measured over three separate frequency ranges.
Figure 11B:
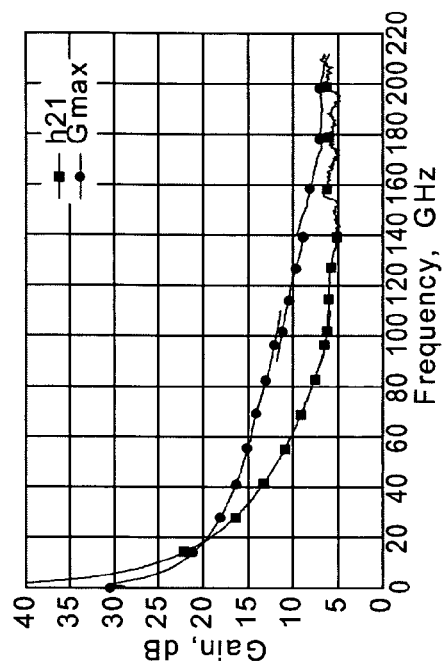
Figure 11C:
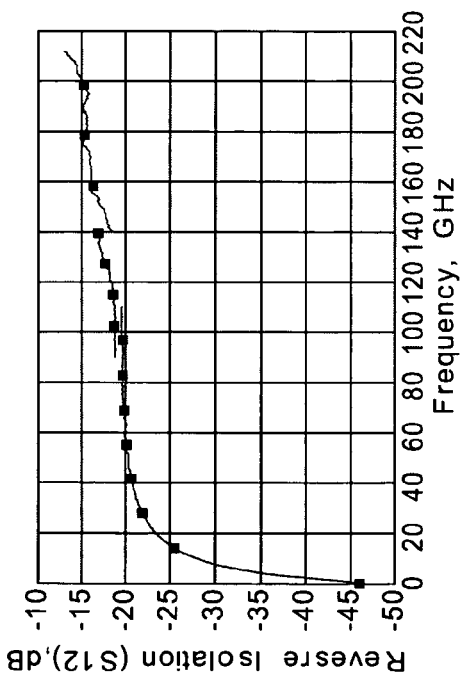
Figure 11D:
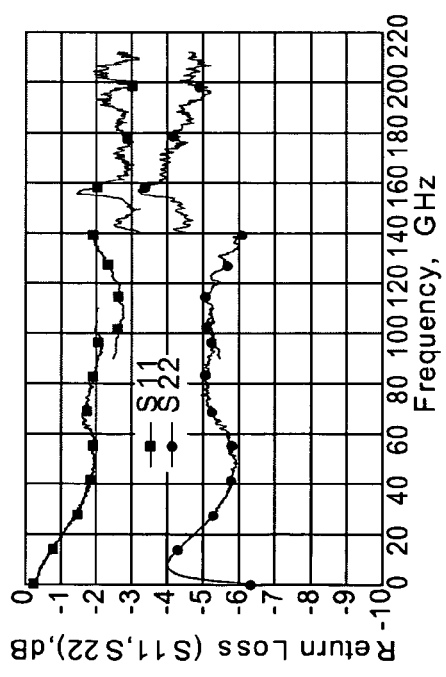

FIGS. 7A and 7B illustrate correlation of less than 0.1 dB magnitude and less than 1 degree phase difference over the entire frequency range in the transmission characteristics measured using the two methods. It is possible that these small differences are a result of the fact that the measurements were acquired on different days with the probes repositioned (e.g., a 1 degree phase difference at 110 GHz corresponds to roughly 3 microns length difference). There is somewhat more difference between the measured reflection values shown in FIGS. 7C and 7D (though this is in large part because the data is plotted in dB rather than unitless magnitude). These differences may be largely due to the differences between the effective port impedance resulting from the different calibrations, as the port impedance is set by transmission line structures for the TRL calibration, but by a resistive load for the LRRM calibration. A transmission line nominally identical to the DUT (from a different wafer reticle) was used for the 5-40 GHz portion of the on-wafer TRL calibration. The return loss in the TRL measurement is significantly lower than that for the LRRM+de-embedding measurement.

Close inspection indicates some nonidealities in the data measured using the TRL calibration (e.g., slight discontinuity in phase at the 40 GHz breakpoint between THRU, aperiodicity in the return loss structure, etc.), whereas the LRRM+ de-embedding data seem to have S11 characteristics more closely resembling the ideal. Given that imperfections in the TRL line structures were found to be evident (e.g. the mild resonance at ~95 GHz), evidence of TRL calibration imperfections is not surprising. In other words, the apparent differences are not related to the de-embedding method. We note that analysis of other measured structures (OPENs, SHORTs, and transistor structures) on the same wafer using the same two methods resulted in similar comparisons.

Of particular interest to the device physics and engineering community is the use of de-embedding in determining transistor figures of merit (e.g. ft and fmax) and in extracting S-parameters used for model extraction. Through appropriate design of a set of single device test structures and accompanying de-embedding structures, it is possible to compare bisect de-embedding to a set of other de-embedding methods, keeping the calibration the same (off-wafer LRRM as described above). The test structures used for LRRM calibration are similar to those shown in FIGS. 6A-6C described above. Additional structures replacing the transistor with shorting metal in one case and with metal removed in a second case allowed the use of Z and Y de-embedding techniques as well.

For the comparisons shown in FIGS. 8A-8D and FIGS. 9A-9D, the device under test is a transistor (SiGe HBT fabricated in IBM 7HP technology), and rather than comparing raw S-parameters, we compare ft and fmax values, as these represent the typical metrics of common interest in such measurements of high performance transistors, and are sensitive to magnitude and phase of all of the S-parameters.

At each measured frequency, three gain values are computed from the measured S-parameters: h21 (small signal current gain), Gmax (maximum stable gain [MSG]/maximum available gain [MAG]), and U (Mason's unilateral gain). Ideally, simple transistor models predict that each of these gain parameters rolls off with a 20 dB/decade slope (except for Gmax which rolls off at roughly 10 dB in the MSG region and 20 dB in the MAG region), but in reality, deviation from this ideal slope is possible due to higher order effects. For example, the ft is computed at each measured frequency by extrapolating the h21 gain at that frequency to unity gain using an assumed 20 dB/decade slope, so if the h21 truly were dropping at 20 dB/decade, the ft plot would be flat over frequency. Similarly, fmax may be computed from U or Gmax in the same fashion. A "Pseudo-fmax" is also shown, extrapolating Gmax at 10 dB/decade, strictly for inspection of the MSG (low frequency) region of Gmax. This method of representing the ft and fmax values brings out much more subtlety than the more traditional method of plotting h21, U, and Gmax on a log frequency scale. This allows the differences between the various methods to be discerned.

In FIGS. 8A-8D, in addition to the bisect de-embedding technique described herein, several different de-embedding methods are compared, applied to the same single HBT measurement: Y (open) subtraction, Z (short) subtraction, as well as combinations of these (Y first, then Z, and Z first, then Y). The raw (non-de-embedded) data is also shown for comparison. Precisely identical results are not expected in this case from one de-embedding method to the next, as the OPEN and SHORT de-embedding structures contain small amounts of additional on-wafer metal trace not present in the THRU structure.

Nonetheless, nearly all de-embedded measurements are similar (with the exception of Z-subtraction alone which is rarely used) as the differences between the de-embedded physical features are small, and the bisect method very closely matches the (commonly used) Y+Z method.

If the lumped element assumption implicit in the Y and Z methods were valid, the Y+Z and Z+Y methods would yield the same results, yet in FIGS. 8A-8D these two methods diverge somewhat at frequencies above 30-40 GHz, suggesting that the lumped element approximation is not strictly valid above these frequencies. In FIGS. 9A-9D, Y and Z de-embedding methods can be used in conjunction with the bisect de-embedding method to remove the small amount of additional trace parasitic remaining after the bisect method has already been applied. Here, the Y+Z and Z+Y methods do result in nearly identical results, as the lumped element approximation applied to the small remaining parasitic elements is valid. Further, the predominant parasitic contribution is capacitive, as all methods utilizing Y subtraction are clustered, while those not utilizing Y are also clustered (not including the data without any de-embedding which is also shown for reference).

Data acquired on a high frequency InP HEMT (fabricated in the same process described above) using three separate instruments will now be described. As above, measurements to 110 GHz were carried out with an HP8510XF. Two sets of extender heads from Oleson Microwave Labs combined with a lower frequency HP8510C. and GGB Industries waveguide probes cover F-band (90-140 GHz) and G-band (140-220 GHz).

In this case, as the on-wafer calibration structures were found to be insufficient for calibrations above 110 GHz, and as the electrical length of the THRU is sufficiently long that Y and Z subtraction techniques are not appropriate, the only reasonable method available to us for computing the de-embedded S-parameters was the bisect de-embedding method described herein. For each of the three frequency bands, an LRRM calibration was performed as described above, but with a GGB CS-15 ISS instead of the CS-5 mentioned above, as the finer CPW geometries on this ISS support measurements to 220 GHz. For logistical reasons, at the time these measurements were performed, it was only possible to acquire data to 212 GHz instead of the full 220 GHz supported by the system, but we do not know of any reason why in principle the same methodologies could not be applied to the last 8 GHz of the range supported by the instrumentation.

The measured data before de-embedding and after de-embedding is shown in FIGS. 10A-10D and FIGS. 11A-11D respectively. S-parameter magnitudes (FIGS. 10A-10C and 11A-11C) as well as h21 and Gmax (FIGS. 10D and 11D) are shown. Relatively small discontinuities are observed at the endpoints of each of the three measurement ranges in both sets of plots, indicating that the calibrations of each of the VNA instruments differ slightly. To some degree, after de-embedding, these discontinuities are improved as, select systematic nonidealities, which apply equally to the measurement of the de-embedding THRU and the DUT (e.g. probe contact resistance), are removed as part of the de-embedding procedure. Improved calibration in the waveguide bands may reduce the magnitude of these discontinuities.

There is relatively little difference between the raw and de-embedded S-parameter magnitudes as, even at 220 GHz, the THRU structure presents a relatively small loss, but the phase differences are larger, as is evidenced by the difference in raw and de-embedded h21 which is sensitive to phase. In principle, the Gmax is insensitive to reactive parasitics and hence should depend little on de-embedding, unless the de-embedding causes the stability factor (K) to cross unity, causing the Gmax to switch from the MSG to MAG region (or vice versa), as is observed in the majority of the 90-140 GHz range.

De-embedding is an important part of single transistor characterization, as the probe pads and interconnects used to contact the single transistors are often large compared with the bare transistors and hence can significantly modify the measured S-parameters used to compute transistor figures of merit (e.g. ft and fmax) and used for model extraction and subsequent circuit design. Many de-embedding methods have been developed and used successfully for this purpose. One of the most widely used is the simple Y subtraction method, in which measured S-parameter measurements on the transistor structure. Here we compare measurements of InP HBT structures (fabricated by Vitesse Semiconductor in a process under development) de-embedded both using a simply Y subtraction method and the bisect de-embedding method described herein.

Figure 12A:
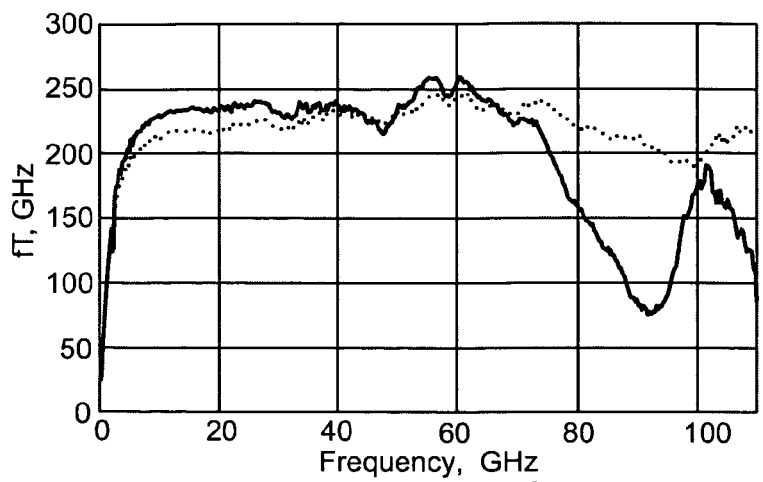
FIGS. 12A-12C show transistor figures of merit derived from measured S-parameters of an InP HBT de-embedded using two different methods.
Figure 12B:
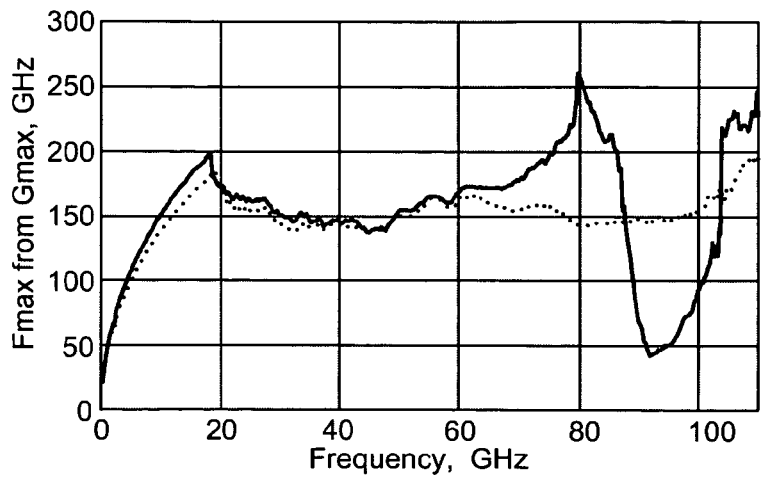
Figure 12C:
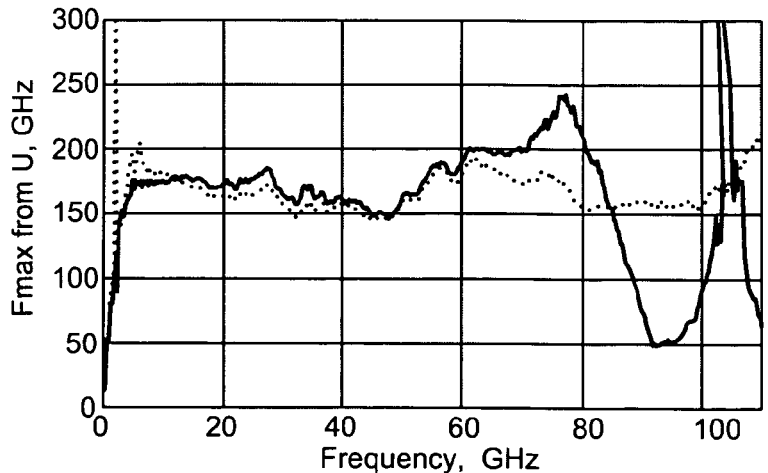
Figure 13B:
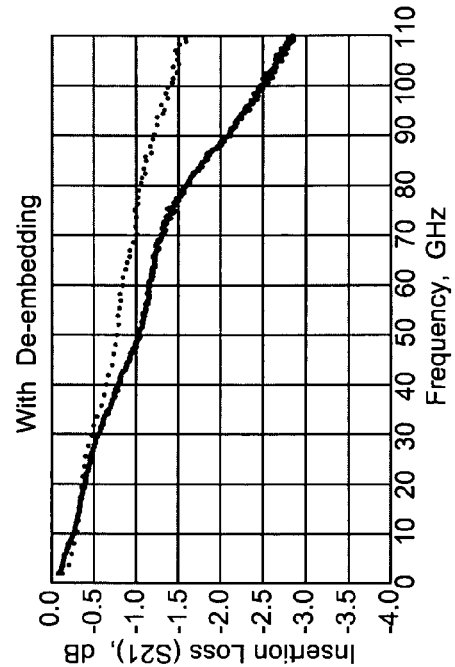
FIGS. 13A-13D show measured S-parameters of CPW and CPWG transmission lines on SiGe HBT wafer. Measurements of S21 magnitude (FIG. 13A) without de-embedding and (FIG. 13B) with de-embedding, and S11 magnitude (FIG. 13C) without de-embedding and (FIG. 13D) with de-embedding are shown.
Figure 13D:
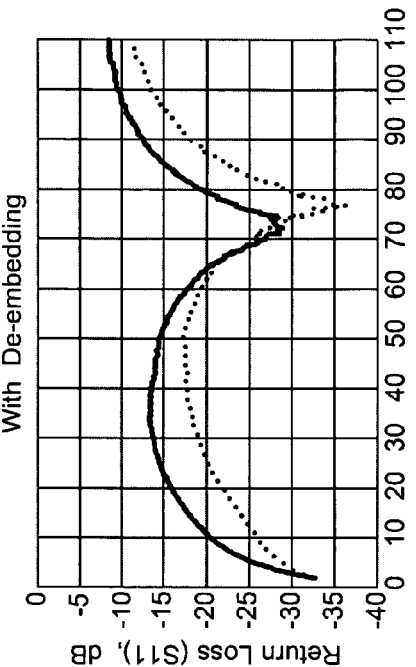
Figure 13A:
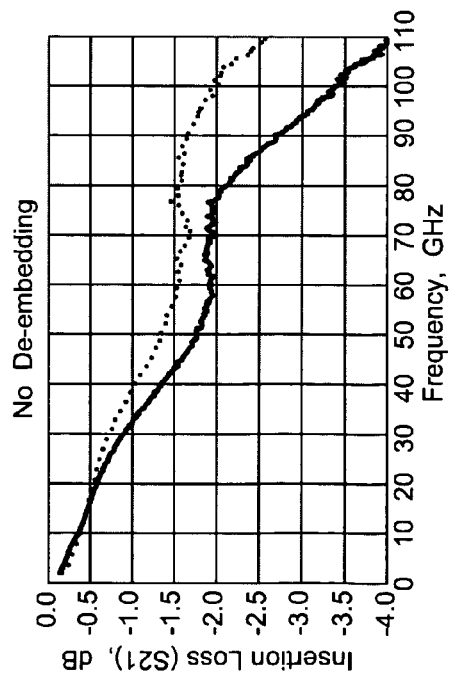
Figure 13C:
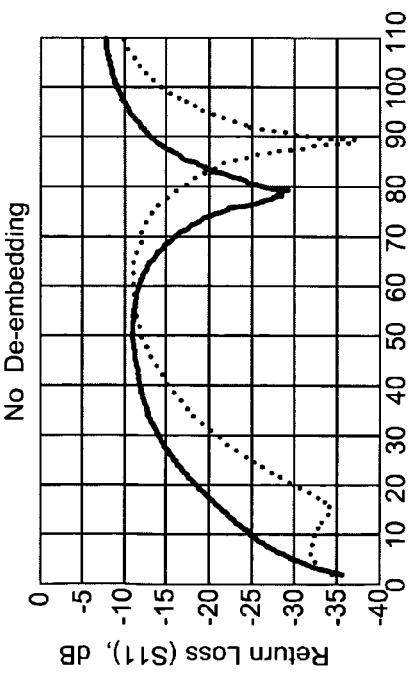

The ft and fmax computed from the measured transistor S-parameters are plotted as a function of frequency in FIGS. 12A-12C. Data de-embedded using both bisect de-embedding and Y subtraction are shown. For each measured frequency, the ft is computed from h21 (FIG. 12A) and the fmax computed both from Gmax (maximum stable gain [MSG]/maximum available gain [MAG]) (FIG. 12B), and U (Mason's unilateral gain, FIG. 12C) by extrapolating the gain at the 20 dB/decade slope predicted by simple transistor small-signal models. A gain metric dropping at the ideal 20 dB/decade rate would show up as a horizontal line in these plots. The two de-embedding methods yield similar results at lower frequencies, but begin to deviate above 60 GHz, where the Y-subtraction data begins to exhibit wide variations over frequency.

Y subtraction amounts to lumped element subtraction of capacitive parasitics. Therefore, the maximum frequency to which this method can be reliably applied depends on the electrical length of the trace de-embedded from each port. In the example shown in FIGS. 12A-12C, the Y subtraction method appears to break down at roughly 60 GHz at which frequency the 225 micron trace length is roughly one eighth of the wavelength (taking into consideration the effective average dielectric constant which is roughly 6). Bisect de-embedding should not suffer from such a limitation in principle, and in fact appears to provide reliable data to higher frequencies. Bisect de-embedding may be used in conjunction with conventional Y and Z subtraction methods to extend their utility to higher frequencies. Use of bisect de-embedding in combination with conventional Y and Z subtraction methods will be described in further detail herein.

In order to measure transmission lines of a fixed cross section (e.g. coaxial cables, printed circuit board traces, thin film metallic traces on ceramic, etc.), it is typically necessary for the device under test to contain discontinuities of one sort or another at the endpoints (e.g. coaxial connectors, printed circuit board vias, coplanar bond pads, etc.). Again, de-embedding of some type or another is desired in order to remove the end discontinuities from the measurement so that data representing the uniform transmission line environment may be recovered. Even if the end discontinuities are physically small enough that lumped element approximations are valid, techniques such as Y and Z subtraction are not readily applicable as the two measured ports are typically far removed from one another.

Bisect de-embedding for analysis of coplanar waveguide (CPW) and grounded coplanar waveguide (CPWG) transmission lines fabricated in the metal layers of an IBM 7HP SiGe HBT integrated circuit wafer will now be described. The CPW portions of both lines were placed on the topmost (and thickest) metal layer. The ground for the CPWG structure was provided by a mesh pattern on the bottommost metal layer, whereas the CPW structure was left open to the silicon substrate below. Coplanar probing pads of slightly different lateral geometry than the CPW and CPWG transmission lines, along with smooth transitions to the transmission line dimensions were added to each end of the transmission lines in order to accommodate ground-signal-ground probes with pitches ranging from 50 to 100 microns. The THRU used for de-embedding consisted of back-to-back instances of the probe pad plus transition structure. Measurements were performed using the same equipment and LRRM de-embedding method described above.

Measured S-parameters (insertion loss and return loss with port 1 stimulus) of 1 mm long lines of each type, with and without de-embedding, are shown in FIGS. 13A-13D. Both the raw and de-embedded insertion loss data (FIG. 13A and FIG. 13B, respectively) indicate that the CPWG line is less lossy (due to shielding of the RF energy from the lossy silicon substrate), but the loss is overestimated somewhat without de-embedding, and ripple is more pronounced. Without de-embedding, the return loss of the two T-lines (FIG. 13C) appear comparable in magnitude (suggesting similar impedances), with the CPWG line somewhat electrically shorter than the CPW line (as the dielectric layers between the metal layers are of a lower dielectric constant than the silicon layers). The CPWG line also exhibits some low frequency ripple uncharacteristic of a uniform transmission line. However, after de-embedding (FIG. 13D), the ripple is gone, it is apparent that the impedances differ slightly, and that the difference in electrical length is not as great as otherwise indicated.

Figure 14A:
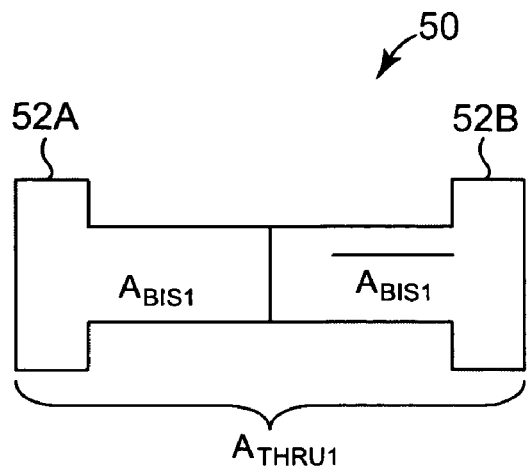
FIGS. 14A-14C show graphical representations of transmission matrix bisect de-embedding, showing (FIG. 14A) a first THRU structure, (FIG. 14B) a second THRU structure and (FIG. 14C) a measurement structure containing embedded device under test.
Figure 14B:
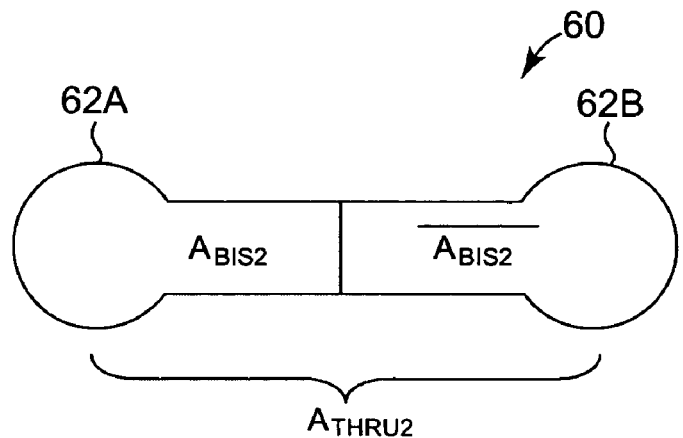
Figure 14C:
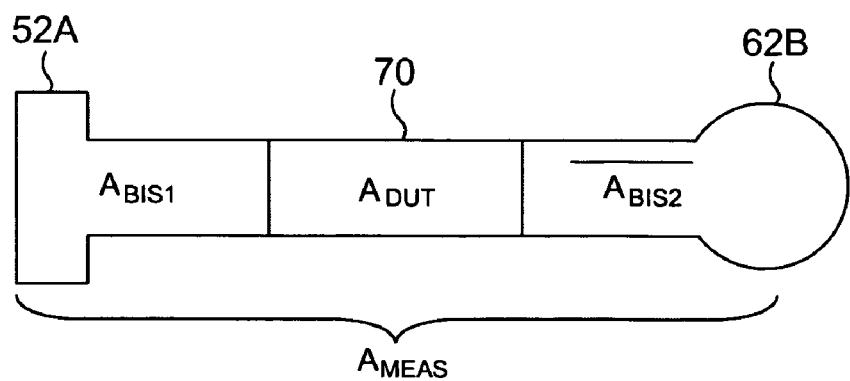

FIGS. 14A-14C show another example environment in which the bisect de-embedding method described herein may be applied. FIG. 14A shows a first symmetric THRU structure, THRU1 50, having two symmetric halves 52A and 52B. FIG. 14B shows a second symmetric THRU structure, THRU2 60, having two symmetric halves 62A and 62B. FIG. 14C shows the device under test (DUT) 70 placed between the first half of the first THRU structure 52A and the second half of the second THRU structure 62B. Note that in this case the THRU structures THRU1 50 and THRU2 60 are each symmetric but are dissimilar to each other. One half of each of the THRU structures 50 and 60 is used to form the two input sections of the two port measurement structure shown in FIG. 14C. The resulting measurement structure shown in FIG. 14C is therefore not itself symmetric about the device under test.

This embodiment of the bisect de-embedding method utilizes transmission matrix mathematics to split each of two substantially symmetric but dissimilar THRU structures, THRU1 50 and THRU2 60, into substantially mirrored halves. One half of each of the THRU structures is used to form the two halves of a two port measurement structure shown in FIG. 14C. The halves of the two dissimilar THRU structures 50 and 60 may then be mathematically removed from both ports of the two port measurement structure, leaving only the DUT 70.

In order to bisect THRU1 and THRU2 into substantially mirror image halves, one desires to solve the following ABCD matrix equations:

$$A_{BIS1} \cdot \overline{A_{BIS1}} = A_{THRU1}, \text{ and}$$

$$A_{BIS2} \cdot \overline{A_{BIS2}} = A_{THRU2}$$

where the overbar indicates symmetric conjugation as described above.

Once $A_{BIS1}$ and $A_{BIS2}$ have been obtained, $A_{DUT}$ can be computed as follows:

$$A_{DUT} = A_{BIS1}^{-1} \cdot A_{MEAS} \cdot (\overline{A_{BIS2}})^{-1}.$$

The bisect de-embedding method can thus be used when one half of each of two substantially symmetric THRU structures is used to form two dissimilar halves of a two port measurement structure.

The technique described with respect to FIGS. 14A-14C may be useful when a use of two halves of a single substantially symmetric THRU structure cannot accurately reflect the physical realities of the measurement structure. This may include, for example, those measurement structures that are not themselves symmetric about the device under test.

Figure 15A:
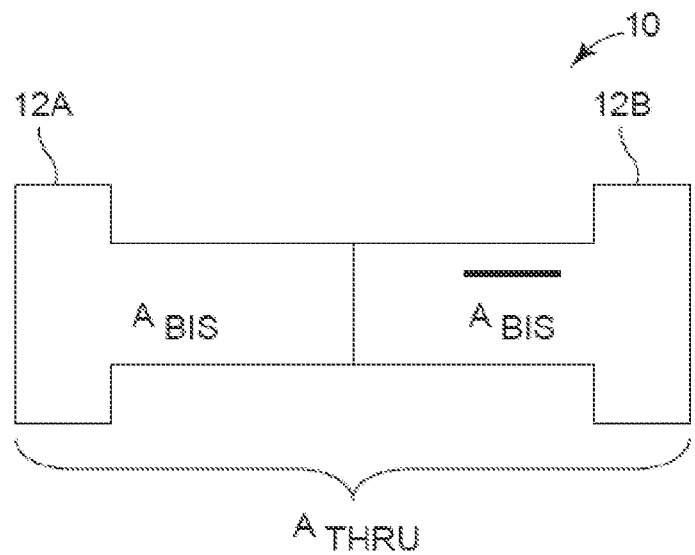
FIGS. 15A and 15B show a graphical representation of transmission matrix bisect de-embedding, showing a THRU structure (FIG. 15A) and a measurement structure containing an embedded device under test (FIG. 15B).
Figure 15B:
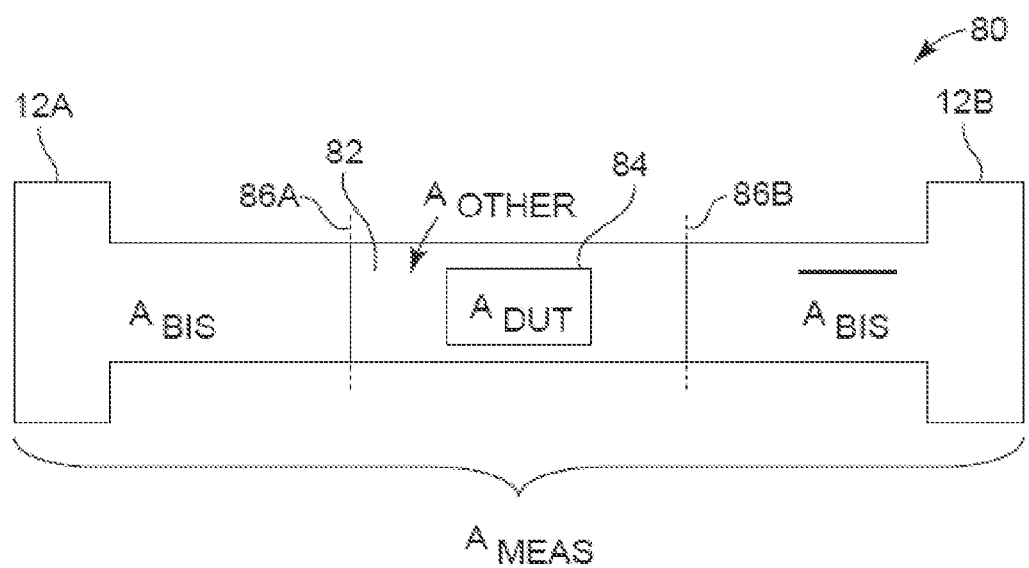

FIGS. 15A-15B show another example environment in which the bisect de-embedding techniques described herein may be applied. FIG. 15A shows a substantially symmetric THRU structure 10 having substantially symmetric mirrored halves 12A and 12B. FIG. 15B shows a measurement structure 80 in which a device under test (DUT) 84 is embedded between the two halves 12A and 12B of the substantially symmetric THRU structure 10.

In this example, reference planes for bisect de-embedding are indicated with reference numerals 86A and 86B. However, once the two halves of the THRU structure outside of reference planes 86A and 86B are mathematically removed via bisect de-embedding, a small area 82 of the measurement structure outside of DUT 84 remains. The transmission characteristics of this small area 82 are indicated as $A_{OTHER}$. $A_{OTHER}$ may be removed using conventional de-embedding techniques, such as Y de-embedding, Z de-embedding, Y+Z de-embedding, Z+Y de-embedding, or other conventionally known de-embedding technique known in the art to obtain the transmission characteristics of the DUT 84.

Bisect de-embedding techniques based on bisection of a single THRU structure and of two dissimilar THRU structures have been described. The de-embedded results compare favorably with alternative methods, and may be combined with conventional methods to improve results over conventional methods alone. Bisect de-embedding techniques may also be applicable to situations other than on-wafer measurements, such as characterization of printed circuit board features.

Even in cases where the mathematical equations representing the THRU bisection may have many solutions or even no exact solution, the algorithm converges to a useful solution. The bisect de-embedding method can be effectively utilized for de-embedding of measured VNA data, as has been shown through several on-wafer measurement examples. The bisection method, and hence the de-embedding method, is not limited by lumped element considerations or other such constraints, allowing applicability to high frequency measurements and/or large delay elements. Comparison with alternative methods indicate that the bisect de-embedding method agrees with well established methods within the range of parameters in which agreement is expected, and it offers benefits complementary to these established methods outside of the range of parameters in which agreement is expected.

Figure 16:
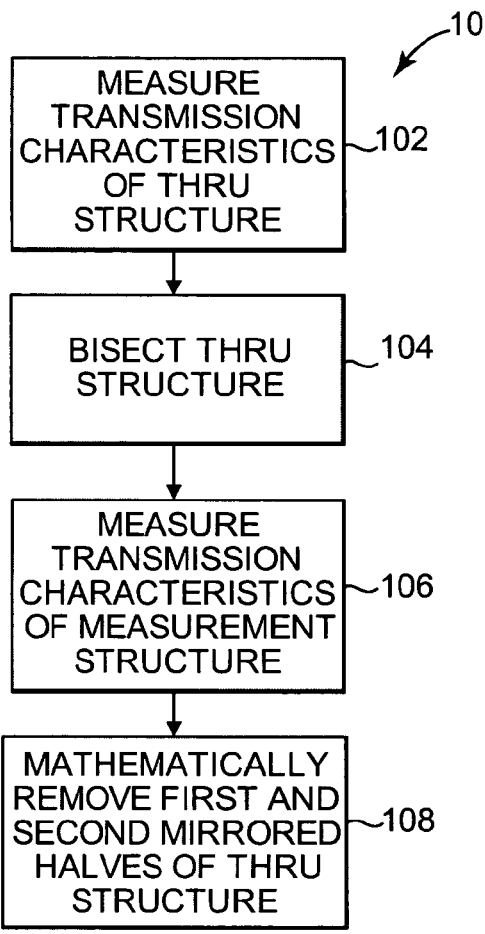
FIG. 16 is a flowchart illustrating an example bisect de-embedding process such as that described above with respect to FIGS. 1A-1B.

FIG. 16 is a flowchart illustrating an example bisect de-embedding process 100 such as that described above with respect to FIGS. 1A-1B. The method includes measuring transmission characteristics of a substantially symmetric THRU structure (102). The measured transmission characteristics of the THRUS structure are bisected into first and second substantially mirrored halves (104). Transmission characteristics of a measurement structure containing a device under test embedded between the first and second mirrored halves (106) are measured. The transmission characteristics of the first and second mirrored halves are mathematically removed from the measured transmission characteristics of the measurement structure to determine the transmission characteristics of the device under test (108).

Figure 17:
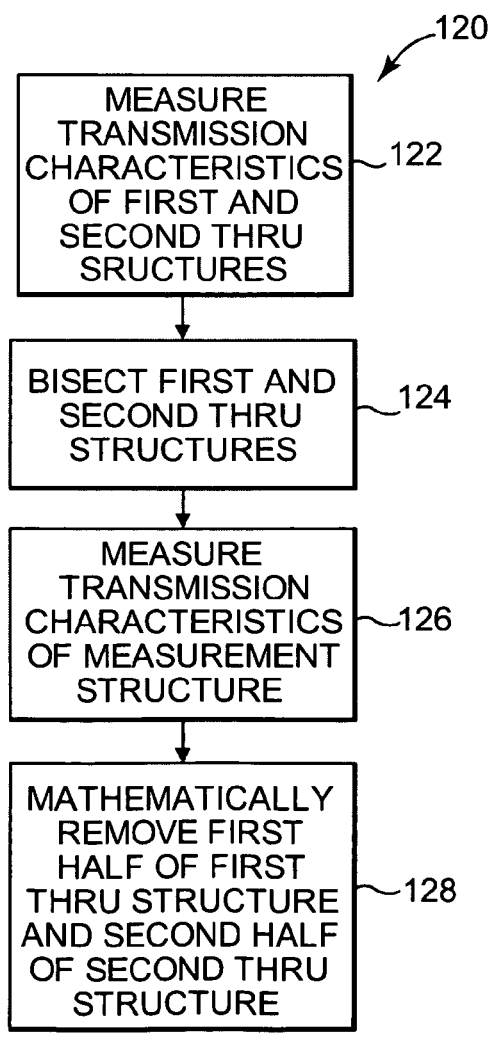
FIG. 17 is a flowchart illustrating an example bisect de-embedding process such as that described above with respect to FIGS. 14A-14C.

FIG. 17 is a flowchart illustrating an example bisect de-embedding process 120 such as that described above with respect to FIGS. 14A-14C. The method includes measuring transmission characteristics of first and second substantially symmetric THRU structures (122). The method bisects the transmission characteristics of the first substantially symmetric THRU structure, THRU1, into first and second substantially mirrored halves, and bisects transmission characteristics of the second substantially symmetric THRU structure, THRU2, into first and second substantially mirrored halves (124). Transmission characteristics of a measurement structure containing a device under test embedded between the first half of the first substantially symmetric THRU structure, THRU1, and the second half of the second substantially symmetric THRU structure, THRU2 are measured (126). The transmission characteristics of the first half of the first substantially symmetric THRU structure, THRU1, and the second half of the second substantially symmetric THRU structure, THRU2, are mathematically removed from the measured transmission characteristics of the measurement structure to determine the transmission characteristics of the device under test (128).

Figure 18:
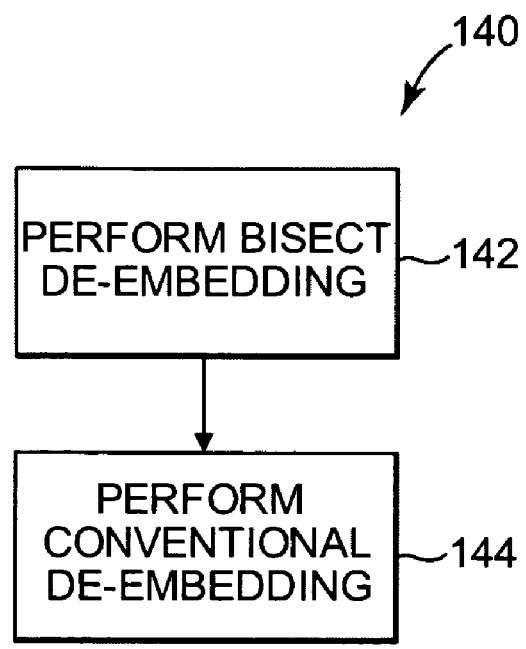
FIG. 18 is a flowchart illustrating an example embodiment of a process for de-embedding a device under test using a combination of bisect de-embedding and a conventional de-embedding technique.

FIG. 18 is a flowchart illustrating an example embodiment of a process (140) for de-embedding a device under test using a combination of bisect de-embedding and a conventional de-embedding technique, such as Y de-embedding, Z de-embedding, Y+Z de-embedding, Z+Y de-embedding, or other conventionally known de-embedding technique known in the art. In this embodiment, the DUT is first de-embedded using the bisect de-embedding techniques described above to obtain a set of intermediate transmission characteristics (142). The resulting intermediate transmission characteristics may then be further dc-embedded using conventionally known de-embedding techniques to determine the transmission characteristics of the device under test (144). The bisect de-embedding technique (142) employed may be one of the techniques described above with respect to FIGS. 1A-1B, FIGS. 14A-14C or FIGS. 15A-15B, for example.

The techniques described herein may be implemented in hardware, software, firmware, or any combination thereof. The invention may be embodied as a computer-readable medium that includes instructions for causing a programmable processor to carry out the methods described above. For example, the computer readable medium may comprise random access memory (RAM), read-only memory (ROM), non-volatile random access memory (NVRAM), electrically erasable programmable read-only memory (EEPROM), flash memory, magnetic or optical media, or the like. The instructions may be implemented as one or more software modules, which may be executed by themselves or in combination with other software.

The instructions and the media are not necessarily associated with any particular computer or other apparatus, but may be carried out by various general-purpose or specialized machines. The instructions may be distributed among two or more media and may be executed by two or more machines. The machines may be coupled to one another directly, or may be coupled through a network, such as a local access network (LAN), or a global network such as the Internet.

The invention may be embodied as one or more devices that include logic circuitry to carry out the functions or methods as described herein. The logic circuitry may include a processor that may be programmable for a general purpose or may be dedicated, such as microcontroller, a microprocessor, a Digital Signal Processor (DSP), Application Specific Integrated Circuit (ASIC), and the like.

Various embodiments of the invention have been described. These and other embodiments are within the scope of the following claims.

I claim:

1. A method comprising bisecting transmission characteristics of a substantially symmetric THRU structure into first and second mirrored halves.

2. The method of claim 1 wherein bisecting transmission characteristics of a substantially symmetric THRU structure further includes utilizing transmission matrix mathematics to bisect the substantially symmetric THRU structure into the first and second mirrored halves.

3. The method of claim 1 wherein bisecting transmission characteristics comprises optimizing the equation $A_{BIS}$· $\overline{A_{BIS}} < A_{THRU}$, wherein $A_{BIS}$ represents a transmission matrix of the first mirrored half, $\overline{A_{BIS}}$ represents a transmission matrix of the symmetric conjugate of $A_{BIS}$, and $A_{THRU}$ represents a transmission matrix of the THRU structure.

4. The method of claim 1 further comprising measuring transmission characteristics of the substantially symmetric THRU structure.

5. The method of claim 1 further comprising:
measuring transmission characteristics of a measurement structure containing an device under test embedded between the first and second mirrored halves; and
mathematically removing transmission characteristics of the first and second mirrored halves from the measured transmission characteristics to determine transmission characteristics of the device under test.

6. The method of claim 5 wherein mathematically removing transmission characteristics of the first and second mirrored halves comprises solving a matrix equation $A_{DUT} = A_{BIS}^{-1} \cdot A_{MEAS} \cdot (\overline{A_{BIS}})^{-1}$, wherein $A_{DUT}$ represents a transmission matrix of the device under test, $A_{MEAS}$ represents a transmission matrix of the device under test and the measurement structure, $A_{BIS}$ represents a transmission matrix of the first mirrored half, and $\overline{A_{BIS}}$ represents a transmission matrix of the second mirrored half.

7. The method of claim 1 wherein the THRU structure comprises a first THRU structure, and further comprising bisecting transmission characteristics of a second substantially symmetric THRU structure into first and second mirrored halves.

8. The method of claim 7 further comprising:
measuring transmission characteristics of a measurement structure containing a device under test embedded between the first mirrored half of the first THRU structure and the second mirrored half of the second THRU structure; and mathematically removing transmission characteristics of the first mirrored half of the first THRU structure and the second mirrored half of the second THRU structure from the measured transmission characteristics to determine transmission characteristics of the device under test.

9. The method of claim 8 wherein mathematically removing transmission characteristics of the first mirrored half of the first THRU structure and the second mirrored half of the second THRU structure comprises solving a matrix equation $A_{DUT} = A_{BIS1}^{-1} \cdot A_{MEAS} \cdot (\overline{A_{BIS2}})^-$, wherein $A_{DUT}$ represents a transmission matrix of the embedded device under test, $A_{MEAS}$ represents a transmission matrix of the embedded device under test and the measurement structure, $A_{BIS1}$ represents a transmission matrix of the first mirrored half of the first THRU structure, and $\overline{A_{BIS2}}$ represents a transmission matrix of the second mirrored half of the second THRU structure.

10. A method comprising:
de-embedding a device under test from between a first half of a first substantially symmetric THRU structure and a second half of a second substantially symmetric THRU structure;
wherein de-embedding the device under test further includes bisecting transmission characteristics of a first substantially symmetric THRU structure into first and second mirrored halves; and
bisecting transmission characteristics of a second substantially symmetric THRU structure into first and second mirrored halves.

11. The method of claim 10, further comprising:
measuring transmission characteristics of a measurement structure containing a device under test embedded between the first mirrored half of the first THRU structure and the second mirrored half of the second THRU structure; and
mathematically removing transmission characteristics of the first mirrored half of the first THRU structure and the second mirrored half of the second THRU structure from the measured transmission characteristics to determine transmission characteristics of the device under test.

12. The method of claim 10 further comprising:
measuring transmission characteristics of the first substantially symmetric THRU structure; and
measuring transmission characteristics of the second substantially symmetric THRU structure.

13. A computer-readable medium comprising instructions to cause a processor to:
bisect transmission characteristics of a substantially symmetric THRU structure into first and second mirrored halves;

measure transmission characteristics of a measurement structure containing a device under test embedded between the first mirrored half of the first THRU structure and the second mirrored half of the second THRU structure; and mathematically remove transmission characteristics of the first mirrored half of the first THRU structure and the second mirrored half of the second THRU structure from the measured transmission characteristics to determine transmission characteristics of the device under test.

14. The computer-readable medium of claim 13, further including instructions to cause a processor to optimize the equation $A_{BIS} \cdot \overline{A_{BIS}} = A_{THRU}$, wherein represents a transmission matrix of the first mirrored half, $\overline{A_{BIS}}$ represents a transmission matrix of the symmetric conjugate of $A_{BIS}$, and $A_{THRU}$ represents a transmission matrix of the THRU structure.

15. The computer-readable medium of claim 13, further including instructions to cause a processor to solve a matrix equation $A_{DUT} = A_{BIS}^{-1} \cdot A_{MEAS} \cdot (\overline{A_{BIS}})^{-1}$, wherein $A_{DUT}$ represents a transmission matrix of the device under test, $A_{MEAS}$ represents a transmission matrix of the device under test and the measurement structure, $A_{BIS}$ represents a transmission matrix of the first mirrored half, and $\overline{A_{BIS}}$ represents a transmission matrix of the second mirrored half.

16. The computer-readable medium of claim 13, further including instructions to cause a processor to measure transmission characteristics of the substantially symmetric THRU structure.

17. A method comprising:
bisect de-embedding a device under test to obtain intermediate transmission characteristics; and
de-embedding the intermediate transmission characteristics using one of Y de-embedding, Z de-embedding, Y+Z de-embedding, or Z+Y de-embedding to obtain transmission characteristics of the device under test.
wherein bisect de-embedding the device under test includes bisecting a substantially symmetric THRU structure into first and second mirrored halves.

18. The method of claim 17, further comprising:
measuring transmission characteristics of a measurement structure containing the device under test embedded between the first and second mirrored halves; and
mathematically removing transmission characteristics of the first and second mirrored halves from the measured transmission characteristics to determine the intermediate transmission characteristics of the device under test.

19. The method of claim 17, further comprising measuring transmission characteristics of the substantially symmetric THRU structure.

* * * * *

UNITED STATES PATENT AND TRADEMARK OFFICE
CERTIFICATE OF CORRECTION

| | | |
|---|---|---|
| PATENT NO. | : 7,643,957 B2 | Page 1 of 1 |
| APPLICATION NO. | : 11/222604 | |
| DATED | : January 5, 2010 | |
| INVENTOR(S) | : Erik S. Daniel | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1102 days.

Signed and Sealed this

Sixteenth Day of November, 2010

David J. Kappos
*Director of the United States Patent and Trademark Office*